(12) United States Patent
Stojetz et al.

(10) Patent No.: US 11,581,702 B2
(45) Date of Patent: Feb. 14, 2023

(54) SEMICONDUCTOR LASER DIODE

(71) Applicant: OSRAM Opto Semiconductors GmbH, Regensburg (DE)

(72) Inventors: Bernhard Stojetz, Wiesent (DE); Christoph Eichler, Donaustauf (DE); Alfred Lell, Maxhütte-Haidhof (DE); Sven Gerhard, Alteglofsheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/608,552

(22) PCT Filed: May 17, 2018

(86) PCT No.: PCT/EP2018/062903
§ 371 (c)(1),
(2) Date: Oct. 25, 2019

(87) PCT Pub. No.: WO2018/219667
PCT Pub. Date: Dec. 6, 2018

(65) Prior Publication Data
US 2020/0194957 A1 Jun. 18, 2020

(30) Foreign Application Priority Data
May 31, 2017 (DE) .......................... 102017111938.8

(51) Int. Cl.
*H01S 3/0941* (2006.01)
*H01S 5/04* (2006.01)
(Continued)

(52) U.S. Cl.
CPC ............ *H01S 5/041* (2013.01); *H01S 3/0632* (2013.01); *H01S 3/09415* (2013.01);
(Continued)

(58) Field of Classification Search
CPC ...... H01S 5/026; H01S 3/09415; H01S 3/041; H01S 5/02325; H01S 5/02326
See application file for complete search history.

(56) References Cited

U.S. PATENT DOCUMENTS 5,379,311 A * 1/1995 McFarlane ............... H01S 3/063
372/39
5,436,919 A * 7/1995 Chwalek ................. H01S 3/063
372/75
(Continued)

FOREIGN PATENT DOCUMENTS

DE 102007058952 A1 4/2009
DE 102018113874 A1 * 12/2019 ............. H01S 5/026
(Continued)

OTHER PUBLICATIONS

Borysiewicz ("ZnO as a functional material, a review"; Crystals 2019, 9 505). (Year: 2019).*
"Dichroism", rp-photonics.com/dichroism.html, 2021 (Year: 2021).*

*Primary Examiner* — Tod T Van Roy
(74) *Attorney, Agent, or Firm* — Slater Matsil, LLP

(57) ABSTRACT

A semiconductor laser diode is disclosed. In an embodiment a semiconductor laser diode includes a first resonator and a second resonator, the first and second resonators having parallel resonator directions along a longitudinal direction and being monolithically integrated into the semiconductor laser diode, wherein the first resonator includes at least a part of a semiconductor layer sequence having an active layer and an active region configured to be electrically pumped to generate a first light, wherein the longitudinal direction is parallel to a main extension plane of the active layer, and wherein the second resonator has an active region with a laser-active material configured to be optically pumped by at (Continued)

least a part of the first light to produce a second light which is partially emitted outwards from the second resonator.

21 Claims, 15 Drawing Sheets

(51) Int. Cl.
*H01S 3/063* (2006.01)
*H01S 5/026* (2006.01)
*H01S 5/028* (2006.01)
*H01S 5/10* (2021.01)
*H01S 5/042* (2006.01)
*H01L 33/00* (2010.01)
*H01S 3/16* (2006.01)
*H01S 5/02* (2006.01)
*H01S 5/22* (2006.01)
*H01S 5/34* (2006.01)
*H01S 5/343* (2006.01)
*H01S 5/0234* (2021.01)

(52) U.S. Cl.
CPC ............ *H01S 5/026* (2013.01); *H01S 5/0287* (2013.01); *H01S 5/1021* (2013.01); *H01L 33/0045* (2013.01); *H01S 3/1608* (2013.01); *H01S 3/1611* (2013.01); *H01S 3/1618* (2013.01); *H01S 3/1623* (2013.01); *H01S 3/1625* (2013.01); *H01S 3/1636* (2013.01); *H01S 3/1643* (2013.01); *H01S 3/1673* (2013.01); *H01S 5/0217* (2013.01); *H01S 5/0234* (2021.01); *H01S 5/04257* (2019.08); *H01S 5/22* (2013.01); *H01S 5/343* (2013.01); *H01S 5/3412* (2013.01); *H01S 2301/176* (2013.01)

(56) References Cited

U.S. PATENT DOCUMENTS

| | | | | |
|---|---|---|---|---|
| 5,463,649 A * | 10/1995 | Ashby | ................... | H01S 3/0941 372/50.1 |
| 5,570,387 A * | 10/1996 | Carriere | ................ | H01S 3/0941 372/39 |
| 5,796,771 A * | 8/1998 | DenBaars | ............... | H01S 5/026 372/75 |
| 5,982,802 A * | 11/1999 | Thony | ................... | H01S 3/0627 372/75 |
| 6,239,901 B1 * | 5/2001 | Kaneko | ................. | H01S 3/0933 372/50.1 |
| 6,424,669 B1 * | 7/2002 | Jiang | ....................... | H01S 5/026 372/75 |
| 6,580,741 B2 * | 6/2003 | Jiang | ....................... | H01S 5/041 372/75 |
| 7,826,511 B1 * | 11/2010 | Yap | ......................... | H01S 5/028 372/75 |
| 8,406,265 B2 * | 3/2013 | Sabathil | .................. | H01S 5/041 372/50.1 |
| 8,434,904 B2 * | 5/2013 | Alvarez | ................ | F21V 31/005 362/267 |
| 9,251,935 B2 * | 2/2016 | Illiberi | ............... | H01B 13/0016 |
| 9,640,706 B2 * | 5/2017 | Woods | ............... | H01L 31/0336 |
| 10,347,857 B2 * | 7/2019 | Matos | ................. | H01L 51/4226 |
| 10,890,819 B2 * | 1/2021 | Cho | ..................... | G02F 1/1523 |
| 2002/0171919 A1 * | 11/2002 | Blauvelt | ................. | H01S 5/026 359/344 |
| 2003/0007538 A1 * | 1/2003 | Jiang | ....................... | H01S 5/041 372/75 |
| 2003/0026312 A1 * | 2/2003 | Clayton | .................. | H01S 5/041 372/50.1 |
| 2006/0039437 A1 * | 2/2006 | Albrecht | ................ | B82Y 20/00 372/70 |
| 2007/0001186 A1 * | 1/2007 | Murai | ..................... | H01L 33/20 438/22 |
| 2010/0272145 A1 * | 10/2010 | Weichmann | ............... | H01S 5/14 372/75 |
| 2011/0150019 A1 * | 6/2011 | Leatherdale | .......... | H01L 33/507 372/45.01 |
| 2011/0249695 A1 | 10/2011 | Kuksenkov et al. | | |
| 2016/0322782 A1 * | 11/2016 | Farrell | ................... | H01L 27/153 |
| 2020/0194957 A1 * | 6/2020 | Stojetz | .................... | H01S 5/041 |
| 2021/0142955 A1 * | 5/2021 | Nicolay | ................. | C23C 16/407 |
| 2021/0249843 A1 * | 8/2021 | Stojetz | ................... | H01S 5/4093 |

FOREIGN PATENT DOCUMENTS

| | | | | |
|---|---|---|---|---|
| EP | 1035623 A1 * | 9/2000 | ............ | B82Y 20/00 |
| KR | 20130125345 | * 11/2013 | | |
| KR | 20130125345 A | * 11/2013 | | |
| WO | 0052791 A2 | 9/2000 | | |
| WO | WO-2019238538 A1 * | 12/2019 | ............. | H01S 5/026 |

* cited by examiner

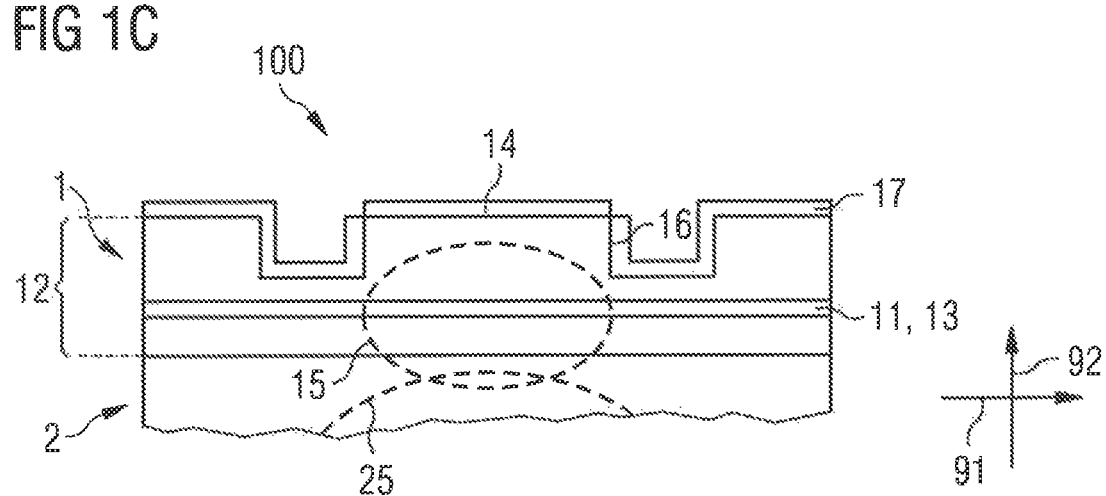
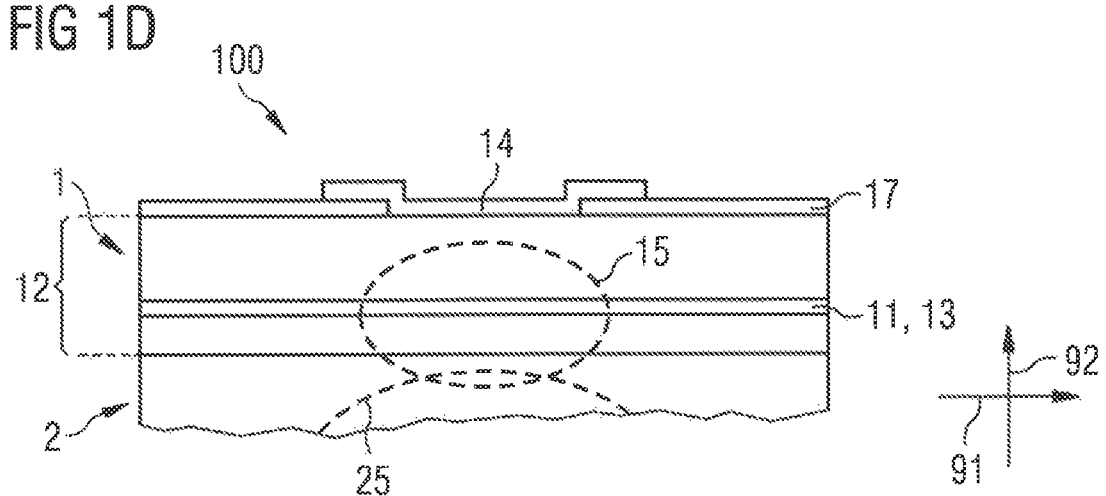

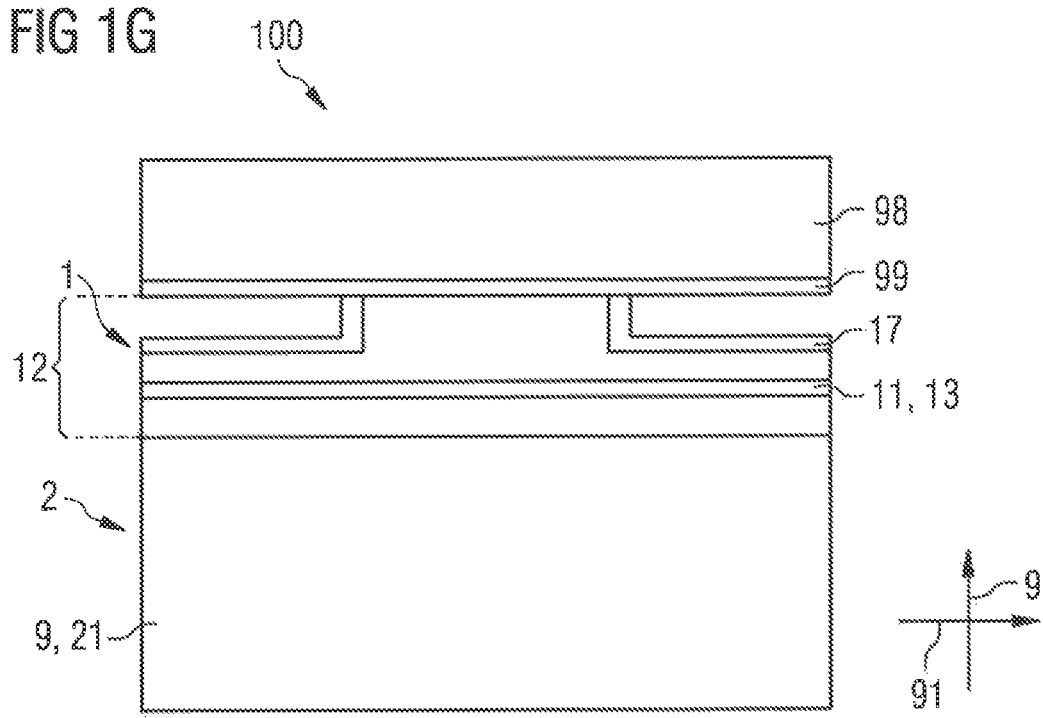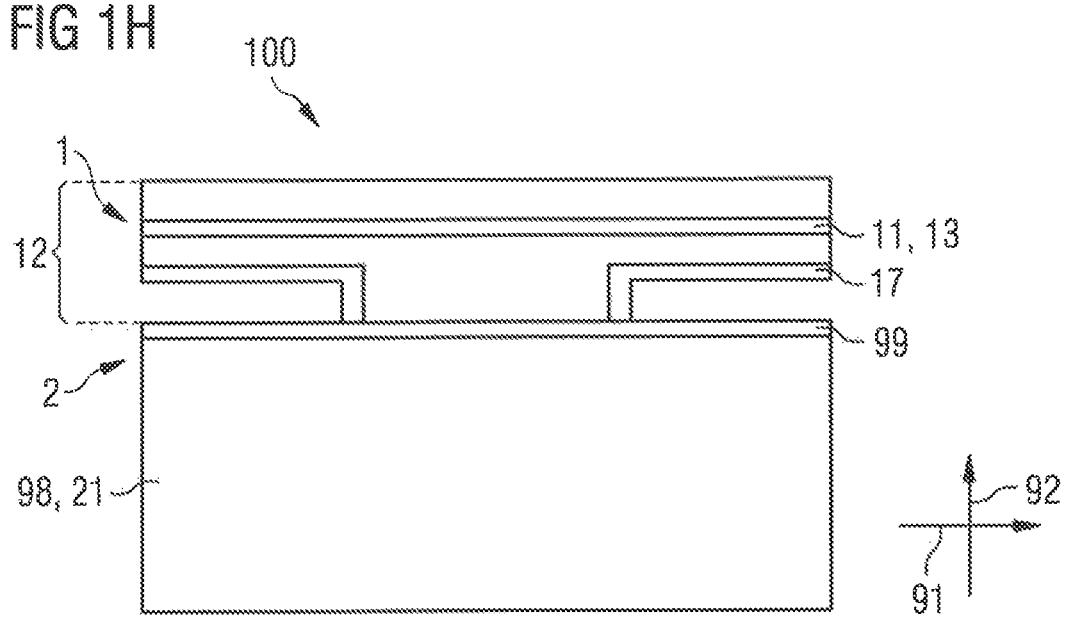

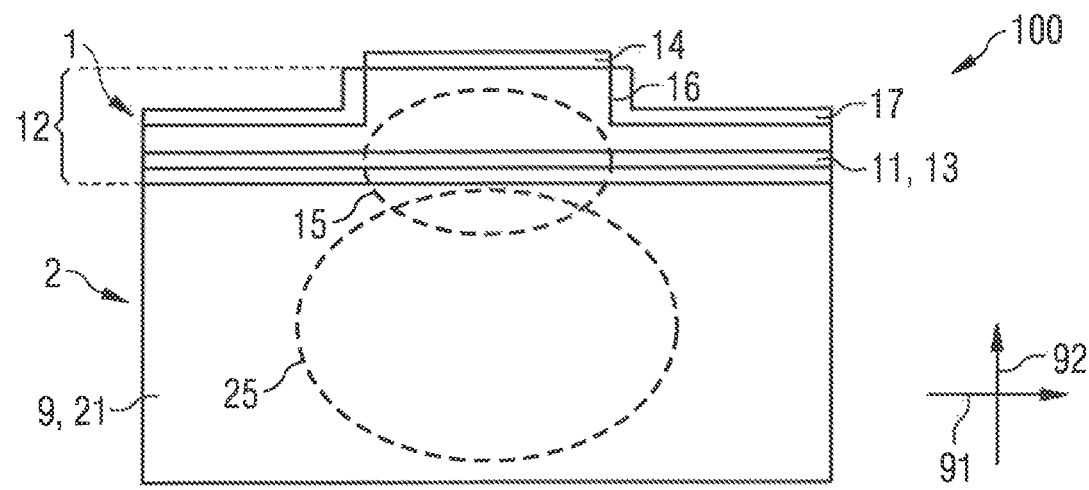
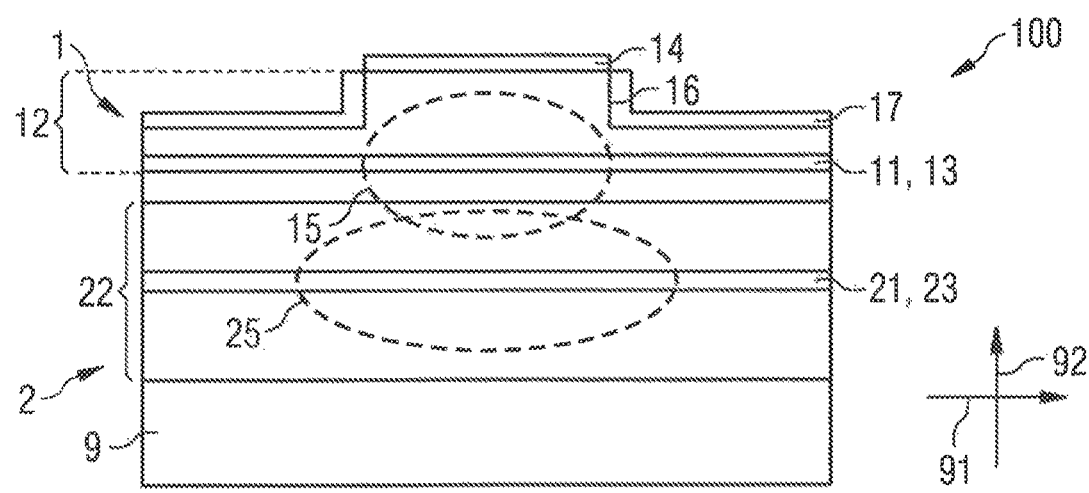
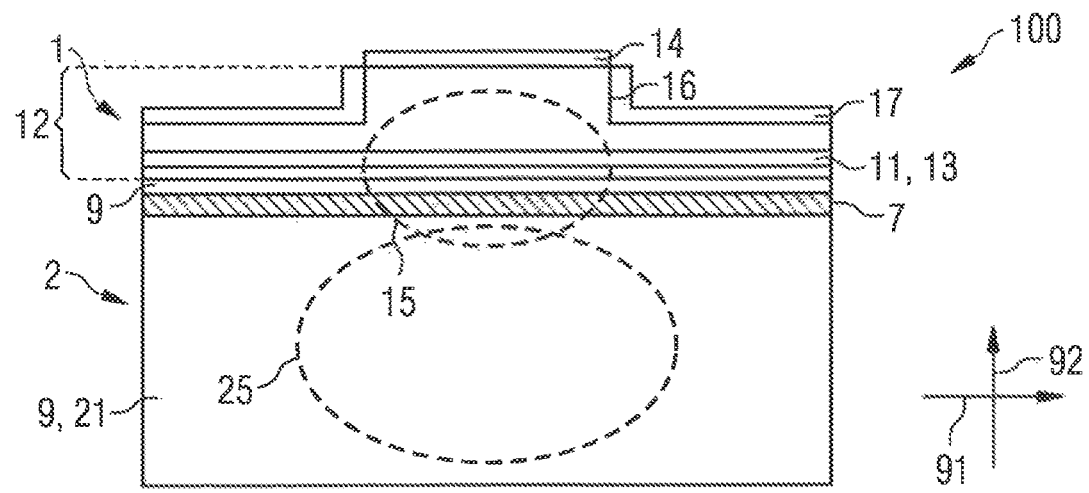

SEMICONDUCTOR LASER DIODE

This patent application is a national phase filing under section 371 of PCT/EP2018/062903, filed May 17, 2018, which claims the priority of German patent application 102017111938.8, filed May 31, 2017, each of which is incorporated herein by reference in its entirety.

TECHNICAL FIELD

A semiconductor laser diode is specified.

BACKGROUND

In many applications, such as projection applications, laser diodes are required that have a sufficiently high output power and at the same time a beam quality that is as independent as possible of current or power in order to be able to focus the laser beam with high efficiency. In order to achieve high optical output powers, broad laser resonator structures are usually used, which often lead to inhomogeneous mode distributions, so-called filamentations, which lead, on the one hand, to a deterioration of the beam quality, especially in the far field, and on the other hand to inhomogeneous intensity distributions on the laser facet, so-called "hot spots" and thus impair the facet stability. This is associated with an increased risk of facet damage. Therefore, laser diodes, which have to meet high requirements regarding beam quality, are limited in their optical power. Conversely, laser diodes with high optical power generally exhibit insufficient beam quality for the reasons mentioned above.

Furthermore, with index-guided and gain-guided laser structures, inhomogeneities can, in the course of process fluctuations, occur in the horizontal wave guidance along the resonator, as a result of which light can escape from the resonator. This scattered light propagates in the laser diode chip to the side of the active region and after being out-coupled via the facet of the laser chip, interferes with the light of the mode guided in the active region, which leads to disturbances in the horizontal far field.

SUMMARY OF THE INVENTION

Embodiments provide a semiconductor laser diode.

According to at least one embodiment, a semiconductor laser diode has at least a first resonator and at least a second resonator. Each of the resonators has a laser-active material, i.e., a material that is suitable for generating laser light by stimulated emission. The excitation of the laser-active material of each of the resonators can take place electrically or optically. The laser-active material of each of the resonators is arranged between respective resonator mirrors. The respective arrangement of the resonator mirrors with the laser-active material between them determines the resonator direction of each of the resonators. The resonators can each have their own resonator mirror or can have one or both resonator mirrors in common. Furthermore, the resonator directions of the resonators are parallel to each other and run along a longitudinal direction of the semiconductor laser diode. The resonators are optically coupled so that light from at least one of the resonators can be coupled into another of the resonators, where it can excite the laser-active material to generate light.

Furthermore, the at least one first resonator and the at least one second resonator are monolithically integrated into the semiconductor laser diode. In other words, the resonators form integral components of the semiconductor laser diode that are permanently connected to each other. Such monolithic integration can be achieved, for example, by a growth process and/or by an implantation process and/or by a bonding process such as wafer bonding.

According to a further embodiment, at least one of the resonators has a semiconductor material as laser-active material. In particular, the first resonator may comprise or be made of a semiconductor layer sequence or at least a part thereof with an active layer and an active region, wherein the active region can be electrically pumped during operation of the semiconductor laser diode to generate a first light. The active region can in particular denote that region in which the generation of one or more laser modes takes place during operation. The longitudinal direction along which the resonator directions run can be parallel to a main extension plane of the active layer. The first resonator can therefore have an edge-emitting laser diode structure or be a part thereof. The first resonator can also be operated below the laser threshold as an alternative to being operated as a laser. In this case, the first resonator can form a so-called superluminescent diode (SLED) or be operated as such. The arrangement direction of the semiconductor layers of the semiconductor layer sequence can be referred to here and in the following as the vertical direction or growth direction. The direction perpendicular to the longitudinal and vertical direction can be denoted as the lateral direction, wherein the lateral and longitudinal directions span a horizontal plane. The main extension planes of the layers of the semiconductor layer sequence, in particular of the active layer, are thus parallel to the longitudinal and lateral direction and are therefore horizontal planes.

The semiconductor layer sequence can in particular be embodied as an epitaxial layer sequence, i.e., as an epitaxially grown semiconductor layer sequence. The semiconductor layer sequence can be based on InAlGaN, for example. InAlGaN-based semiconductor layer sequences include in particular those in which the epitaxially produced semiconductor layer sequence generally comprises a layer sequence of different individual layers which contains at least one individual layer which comprises a material from the III-V compound semiconductor material system $In_xAl_yGa_{1-x-y}N$- with $0 \leq x \leq 1$, $0 \leq y \leq 1$ and $x+y \leq 1$. In particular, the active layer can be based on such a material. Semiconductor layer sequences that have at least one active layer based on InAlGaN can, for example, emit electromagnetic radiation in an ultraviolet to green wavelength range.

Alternatively or additionally, the semiconductor layer sequence can also be based on InAlGaP, i.e., the semiconductor layer sequence can have different individual layers, of which at least one individual layer, e.g., the active layer, comprises a material made of the III-V compound semiconductor material system $In_xAl_yGa_{1-x-y}P$ with $0 \leq x \leq 1$, $0 \leq y \leq 1$ and $x+y \leq 1$. Semiconductor layer sequences which have at least one active layer based on InAlGaP can, for example, preferably emit electromagnetic radiation with one or more spectral components in a green to red wavelength range.

Alternatively or additionally, the semiconductor layer sequence may also comprise other III-V-compound semiconductor material systems, such as an InAlGaAs-based material, or II-VI-compound semiconductor material systems. In particular, an active layer comprising an InAlGaAs based material may be capable of emitting electromagnetic radiation having one or more spectral components in a red to infrared wavelength range. A II-VI-compound semiconductor material may have at least one element from the second main group, such as Be, Mg, Ca, Sr, and one element from the sixth main group, such as O, S, Se. For example, the II-VI compound semiconductor materials include ZnSe, ZnTe, ZnO, ZnMgO, CdS, ZnCdS and MgBeO.

The active layer of the first resonator and, in particular, the semiconductor layer sequence with the active layer can be arranged on a substrate. For example, the substrate can be embodied as a growth substrate on which the semiconductor layer sequence is grown. The active layer and, in particular, the semiconductor layer sequence with the active layer can be produced by means of an epitaxial process, for example, by means of metal-organic vapor phase epitaxy (MOVPE) or molecular beam epitaxy (MBE). This can in particular mean that the semiconductor layer sequence is grown on the growth substrate. Furthermore, the semiconductor layer sequence can be provided with electrical contacts in the form of electrode layers, so that the first resonator can be electrically pumped. Moreover, it may also be possible that the growth substrate is removed after the growth process. In this case, the semiconductor layer sequence can, for example, also be transferred after growth to a substrate embodied as a carrier substrate. The substrate may comprise a semiconductor material, such as a compound semiconductor material system mentioned above, or another material. In particular, the substrate can comprise or be made of sapphire, GaAs, GaP, GaN, InP, SiC, Si, Ge and/or a ceramic material as for instance $Si_3N_4$ or AlN. Furthermore, the substrate can comprise or be made of YAG (yttrium aluminum garnet) and/or yttrium vanadate ($YVO_4$), which can also be doped.

The active layer of the first resonator can, for example, comprise a conventional pn junction, a double heterostructure, a single quantum well structure (SQW structure) or a multiple quantum well structure (MQW structure) for generating light. The semiconductor layer sequence may include other functional layers and functional regions in addition to the active layer of the first resonator, such as p- or n-doped carrier transport layers, i.e., electron or hole transport layers, undoped or p-doped or n-doped confinement, cladding or waveguide layers, barrier layers, planarization layers, buffer layers, protective layers and/or electrode layers, and combinations thereof. Moreover, additional layers such as buffer layers, barrier layers and/or protective layers can be arranged also perpendicular to the growth direction of the semiconductor layer sequence, for instance around the semiconductor layer sequence, such as for instance on side surfaces of the semiconductor layer sequence.

According to a further embodiment, the semiconductor layer sequence and thus the first resonator has at least one ridge waveguide structure. When the semiconductor laser diode comprises a substrate on which the semiconductor layer sequence is deposited, the ridge waveguide structure is formed on a top side of the semiconductor layer sequence opposite the substrate. Even if the semiconductor laser diode has no substrate, here and in the following the side with the ridge waveguide structure is referred to as the top side. The ridge waveguide structure can in particular be formed by a ridge-shaped, longitudinally extending elevated region of the semiconductor layer sequence. In other words, the ridge-shaped region protrudes vertically beyond the adjacent surface regions and runs along a longitudinal direction. The side surfaces bounding the ridge waveguide structure in the lateral direction can form a step profile, especially with the adjacent surface regions of the top side of the semiconductor layer sequence. The terms "ridge-shaped region", "ridge" and "ridge waveguide structure" may be used synonymously in the following. Furthermore, the semiconductor layer sequence may also include a plurality of laterally juxtaposed and spaced apart ridge-shaped regions each extending in a longitudinal direction.

According to a further embodiment, the second resonator has an active region with a laser-active material that can be optically pumped by at least part of the first light during operation of the semiconductor laser diode. This allows the second resonator to be excited to produce a second light which is partially radiated outwards from the second resonator. The first light of the first resonator thus forms a pump light for the optical pumping of the second resonator. For this purpose, the first light is extracted from the first resonator during operation of the semiconductor laser diode and coupled into the second resonator. In summary, the first resonator forms an electrically-pumped pump beam source that optically pumps the second resonator, which thus forms an optically-pumped beam source. The second light, which is partially emitted to the outside, forms the laser radiation emitted by the semiconductor laser diode. The longitudinal direction can particularly preferably be the emission direction of the second light and thus of the laser light emitted from the semiconductor laser diode to the outside during operation.

In particular, the semiconductor laser diode can be embodied such that only second light is emitted, while first light remains "enclosed" in the semiconductor laser diode. For this purpose, the first resonator can be completely mirror-coated for the first light on both sides along its resonator direction. Completely mirror-coated can mean that less than 10% or less than 5% or less than 1% or less than 0.5% or less than 0.1% or particularly preferably 0% of the first light is emitted from the first resonator along the resonator direction. The semiconductor laser diode can have common mirror layers for the first and second resonators, i.e., mirror layers that have a suitable reflectivity for both the first and second light. Furthermore, the semiconductor laser diode can also have different mirror layers for the first and second resonators, which are independently optimized for the desired functionality. These can also be applied merely after the resonators have been integrated, for example, using shadow masks and/or oblique evaporation from different directions.

The second resonator, which in particular can be embodied so that it can be pumped exclusively optically and not electrically, forms, due to the described indirect operation via the optical pumping by means of the first resonator, an element which leads to an improvement of the beam quality in comparison to a purely electrically pumped laser diode, since effects which can affect the beam quality of the electrically pumped laser radiation in electrically pumped beam sources affect the beam quality of the electrically pumped laser radiation to a lesser extent and particularly preferably not at all. In this respect, the second resonator can also be denoted as a beam-shaping element of the semiconductor laser diode.

Compared to the semiconductor laser diode described here, diode-pumped solid-state lasers, for example, require a comparatively large amount of space, because the individual components have to be arranged one behind the other or next to each other as discrete components. Further optical components are also required to map the pump laser beam onto a solid-state laser crystal, to build a resonator for the solid-state laser beam and to decouple the solid-state laser beam. The technical implementation of these requirements takes place through a complex combination of individual components adjusted to each other. Due to the high space requirement and the complex and cost-intensive assembly, this solution approach is unsuitable for many applications.

In the case of the semiconductor laser diode specified here, however, the pump beam source in the form of the first resonator and the beam shaping element in the form of the second resonator are monolithically integrated as described above. Due to the fact that the second resonator forms an element integrated into the diode, a very compact design is possible, for example, in comparison to diode-pumped solid-state lasers. At the same time a high beam quality can be achieved. The laser threshold of the pump beam source, i.e., of the first resonator, can be greatly reduced by the preferred double-sided full mirroring of the first resonator. Furthermore, an undesired emission of the pump radiation can be suppressed and at the same time an increased coupling of the pump radiation into the second resonator can take place. As described above, it may also be possible to operate the first resonator as a superluminescent diode and thus below the laser threshold of the first resonator.

According to a further embodiment, the first resonator and the second resonator are arranged offset to each other along a direction perpendicular to the longitudinal direction. The resonators are thus arranged side by side in a lateral direction and/or in a vertical direction. If one defines a resonator axis along the resonator direction for each of the resonators, which can be, for example, an axis of symmetry or a line of gravity in relation to the generated modes, the resonator axes of the first and second resonators are offset in a direction perpendicular to the longitudinal direction. This means in particular that if, in addition to the second light emitted during operation of the semiconductor laser diode, the first light and the second light were emitted to the outside, the first light and the second light would exit the semiconductor laser diode laterally offset to each other. If the semiconductor laser diode comprises, as described below, several first and/or several second resonators, in particular all resonators of the semiconductor laser diode are arranged in pairs offset to each other along a direction perpendicular to the longitudinal direction.

In order to achieve an effective coupling of first light into the second resonator during operation of the semiconductor laser diode, it is necessary that optical modes in the first resonator and second resonator overlap in a direction perpendicular to the longitudinal direction. Particularly preferably, during the operation of the semiconductor laser diode a proportion of greater than or equal to 10% and less than or equal to 99% of the power of the first light is coupled into the second resonator. Therefore, between the laser-active materials of the first and second resonators, at least some materials can be spatially arranged that are at least partially transparent to the first light. For example, the first and second resonators can be optically and mechanically coupled to each other by an at least partially transparent connecting layer. If the semiconductor laser diode is embodied so that current flows through the second resonator during operation to operate the first resonator, it can be particularly advantageous if the connecting layer is electrically conductive. For this purpose, the connecting layer may at least partially comprise a transparent conductive oxide and/or a patterned metal layer. It can also be advantageous if the connecting layer is dichroic. In particular, in this case the connecting layer can be at least partially transparent to the first light, but opaque to the second light, so that first light can be coupled into the second resonator, but no second light can be coupled into the first resonator.

The spatial arrangement of the resonators of the semiconductor laser diode can be carried out according to one or more of the arrangement variants described below, taking into account a sufficient optical coupling of the resonators.

For example, the first and second resonators can be arranged one above the other in the vertical direction corresponding to the growth direction of the semiconductor layer sequence. The first resonator, for example, can be mounted or grown on the second resonator in a vertical direction. In a top view along the vertical direction, the first and second resonators can be arranged exactly above each other. Alternatively or additionally, the first and second resonators can be arranged side by side in the lateral direction. In a view in the lateral direction, for example, the first and second resonators can be arranged in the same plane. It is also possible to arrange the resonators vertically and laterally offset to each other.

Furthermore, it may also be possible that the second resonator has a first part and a second part each with a laser-active material, and the semiconductor layer sequence of the first resonator is arranged between the first and the second part. Here the first and second part of the second resonator and the first resonator can form a kind of "sandwich structure" in a vertical direction or in a lateral direction, for example.

Furthermore, one of the resonators of the semiconductor laser diode may have a recess in which another of the resonators of the semiconductor laser diode is arranged. For example, the first resonator may have a recess, i.e., in particular the semiconductor layer sequence of the first resonator in which the second resonator, in particular the laser-active material of this resonator, is inserted. Alternatively, the second resonator may have a recess in which the first resonator is inserted. In particular, the laser-active material of the second resonator may have a recess in which the first resonator, i.e., in particular the semiconductor layer sequence of the first resonator, is inserted. The first resonator can also be completely embedded in the second resonator, i.e., at least in all directions perpendicular to the longitudinal or vertical direction, or surrounded on all sides by laser-active material of the second resonator. Even if one resonator is inserted into another, the resonators can be arranged offset to each other in a direction perpendicular to the longitudinal direction as described above, i.e., the resonator axes do not overlap but are arranged offset to each other in a direction perpendicular to the longitudinal direction.

According to a further embodiment, the active region of the second resonator, i.e., the laser-active material of the second resonator, comprises at least partially a material selected from GaN, SiC, sapphire, YAG, $YVO_4$. Furthermore, the laser-active material of the second resonator may comprise at least one dopant acting as a luminous center, which may in particular be selected from Ce, Cr, Er, Nd, Ti, Pr and Yb. For example, the laser-active material of the second resonator can comprise or be made of Cr or Ti doped sapphire, Nd doped YAG and/or Nd doped $YVO_4$. Furthermore, the laser-active material of the second resonator may contain quantum dots as an optically pumpable medium, for example, with or made of InGaAs, CdSe and/or GaInP/InP. Here the second resonator can be at least part of a growth substrate described above, on which the semiconductor layer sequence of the first resonator has been grown, or at least part of a carrier substrate described above, to which the semiconductor layer sequence of the first resonator has been transferred after having been grown on a growth substrate.

Furthermore, it may also be possible that the active region of the second resonator comprises at least part of a semiconductor layer sequence. In particular, the first and second resonators may be parts of the same semiconductor layer sequence. The semiconductor layers that are part of the second resonator can all be equally doped or undoped, since the second resonator is not electrically pumped.

According to a further embodiment, no electrical charge carriers are passed through the second resonator during operation of the semiconductor laser diode. In other words, the second resonator in this case is located outside the electrically energized region of the semiconductor laser diode. The semiconductor laser diode can then, for example, have electrical contacts on a side facing away from the second resonator for electrical contacting of the first resonator. Alternatively, electrical charge carriers can be conducted through the second resonator during operation of the semiconductor laser diode. In this case, the second resonator can be arranged on the n- or p-side of the semiconductor layer sequence of the first resonator and thus in the electrically energized region. In this case, the second resonator is electrically conductive, for example, formed by one or more semiconductor layers or a semiconducting substrate according to the previously described embodiments.

According to a further embodiment, the second resonator forms a functional region of the first resonator. This can mean, for example, that the second resonator at least partly contributes to the waveguiding in the first resonator. In other words, the second resonator may be formed and provided in place of or in addition to one or more layers of the semiconductor layer sequence of the first resonator. For example, the semiconductor layer sequence of the first resonator can be free of cladding layers on the side facing the laser-active material of the second resonator, and the laser-active material of the second resonator can form a cladding layer for the first resonator. Here, the laser-active material of the second resonator and thus the second resonator itself can directly or indirectly adjoin a waveguide layer of the semiconductor layer sequence of the first resonator via a connecting layer described above.

According to a further embodiment, the semiconductor laser diode has a first side surface forming a light-outcoupling surface and a second side surface forming a rear surface opposite the first side surface. An outcoupling mirror layer can be applied to the first side surface, which completely reflects the first light and which is partially transparent to the second light. The outcoupling mirror layer can thus serve simultaneously as resonator mirror of both the first resonator and the second resonator. On the second side surface, a rear-side mirror layer can be applied which is completely reflective for the first and second light, so that the rear-side mirror layer can also serve simultaneously as a resonator mirror of both the first resonator and the second resonator. Furthermore, it may also be possible for the outcoupling mirror layer to have on the first side surface a first and a second mirror layer, the first mirror layer being fully reflective for the first light and the second mirror layer being more reflective for the second light than the first mirror layer. This allows the reflective properties of the outcoupling mirror layer to be independently adjusted with respect to the first and second light. Furthermore, the rear-side mirror layer may also comprise a first and a second mirror layer, the first mirror layer being fully reflective for the first light and the second mirror layer being fully reflective for the second light.

Furthermore, in addition to the first side surface forming a light-outcoupling surface and the second side surface forming a rear surface, the semiconductor laser diode may also have at least one further side surface and/or a bottom side on which a mirror coating is applied. Such additional mirroring, which together with the mirror layers on the first and second side surfaces can also form an all side mirroring, can, for example, ensure that the first light or the second light or, preferably, the first and second light cannot escape from the first resonator and/or, in particular, from the second resonator in an undesirable direction. The mirror layers on the first and second side surfaces and the mirroring on other side surfaces or on the bottom side of the semiconductor laser diode may be formed by or comprise Bragg mirrors and/or metal mirrors, for example.

According to a further embodiment, the semiconductor laser diode has a plurality of first resonators and/or a plurality of second resonators, and all first and second resonators of the semiconductor laser diode are monolithically integrated into the semiconductor laser diode. For example, a first resonator can optically pump two or more second resonators. Furthermore, a second resonator can be optically pumped by more than one first resonator. The above described embodiments and features apply similarly in case that several first resonators and/or several second resonators are monolithically integrated in the semiconductor laser diode.

BRIEF DESCRIPTION OF THE DRAWINGS

Further advantages, advantageous embodiments and further developments are revealed by the embodiments described below in connection with the figures, in which:

FIGS. 1C to 1H show schematic illustrations of semiconductor laser diodes according to further embodiments, FIGS. 2 to 6 show schematic illustrations of semiconductor laser diodes according to further embodiments.

Figure 1A:
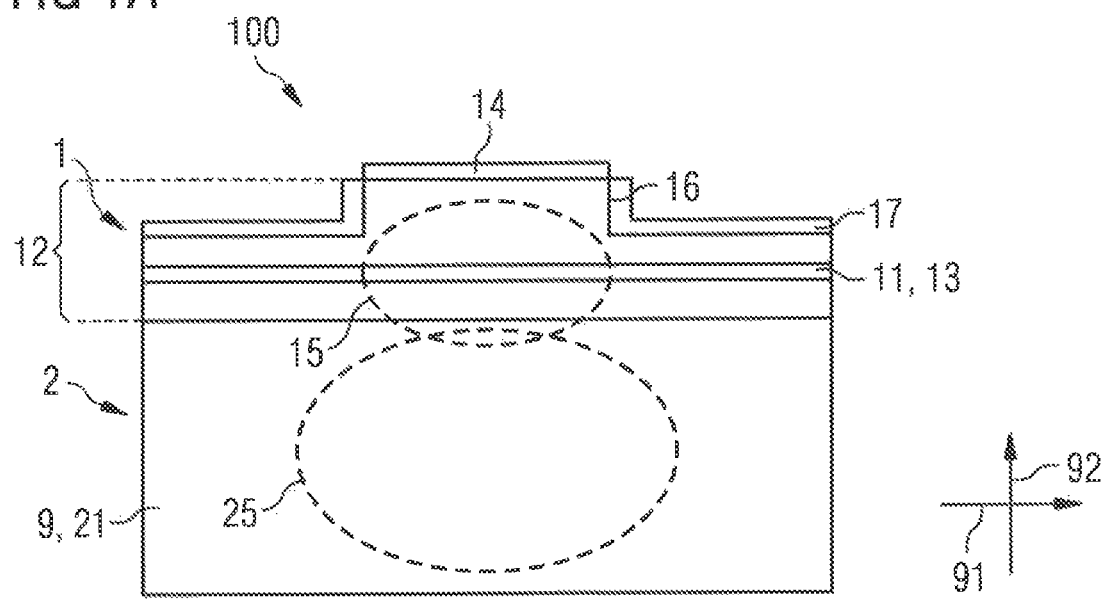
FIGS. 1A and 1B show schematic illustrations of a semiconductor laser diode according to an embodiment.

In the embodiments and figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

Figure 1B:
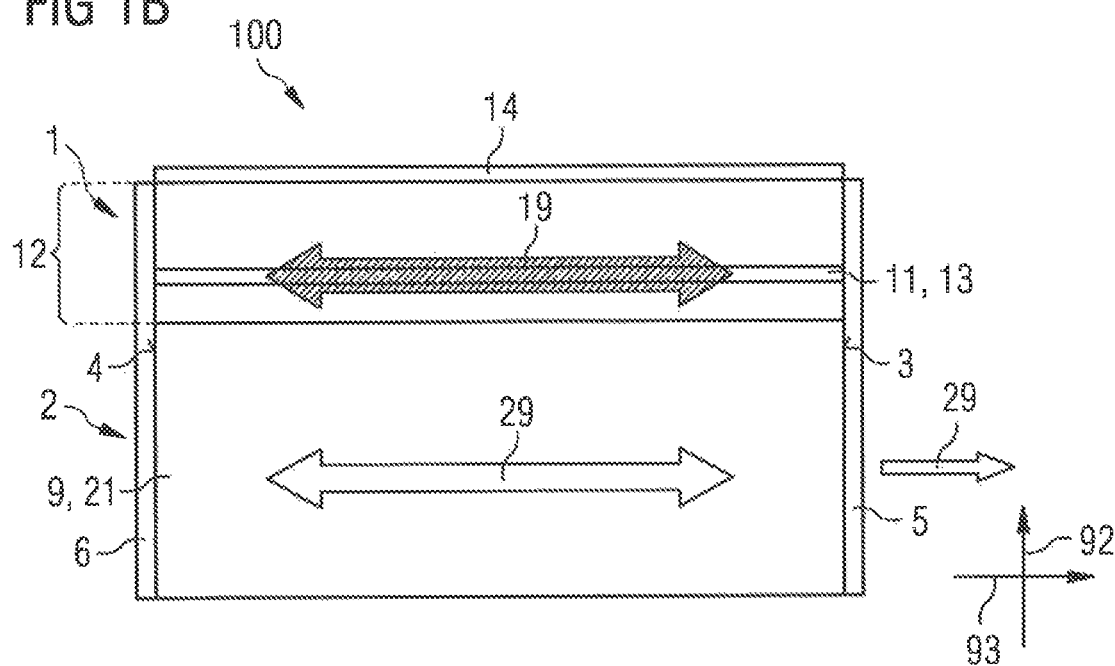

FIGS. 1A and 1B show an embodiment of a semiconductor laser diode 100, wherein FIG. 1A shows a section through the semiconductor laser diode 100 along a transverse sectional plane and FIG. 1B shows a section through the semiconductor laser diode 100 with a sectional plane perpendicular to the light-outcoupling surface 3. The following description applies equally to FIGS. 1A and 1B.

The semiconductor laser diode 100 has a first resonator 1 with a first laser-active material 11 and a second resonator 2 with a second laser-active material 21. The first resonator 1 is embodied to generate first light 19 during operation, the second resonator 2 is embodied to generate second light 29 during operation. If the respective laser threshold is exceeded, this is laser light, i.e., coherent light in the form of one or more laser modes each defining an active region 15, 25 of the resonators 1, 2, respectively.

Each of the resonators 1, 2 has resonator mirrors in addition to the respective laser-active material 11, 21. The arrangement of the resonator mirrors and the laser-active material between them results in a resonator direction for each resonator 1, 2, along which longitudinal light propagation takes place. The resonator directions of the first and second resonators 1, 2 therefore run along the longitudinal direction indicated by 93 in FIG. 1B. Since light that is generated in a resonator exits through a corresponding not fully mirroring resonator mirror and is emitted along the resonator direction, the longitudinal direction also corresponds to the radiation direction of the semiconductor laser diode 100.

The resonator mirrors can, for example, be mounted on a first side surface and a second side surface of the semiconductor laser diode 100, as in the embodiment shown. In particular, the first side surface may, as shown, be a light-outcoupling surface 3 and the second side surface may be a rear surface 4 opposite the light-outcoupling surface 3. In the embodiment shown, the resonator mirrors of both resonators are formed, as depicted in FIG. 1B, by an outcoupling mirror layer 5 arranged on the light-outcoupling surface 3 and by a rear-side mirror layer 6 applied to the rear surface 4. The resonator mirrors can be single-layered or multi-layered and can have, for example, one or more metals and/or one or more dielectric layers. Further features of the resonator mirrors are described below in connection with further embodiments.

The resonators 1, 2 are monolithically integrated into the semiconductor laser diode 100. This means that the resonators 1, 2 are permanently connected to each other and thus together form a single component in the form of the semiconductor laser diode 100 or of at least a part of it. Further below, possibilities for monolithic integration are described.

The first resonator 1 has a semiconductor material as laser-active material 11. In particular, the semiconductor laser diode 100 has a semiconductor layer sequence 12, wherein at least a part or all of the semiconductor layer sequence 12 is part of the first resonator 1. The semiconductor layer sequence 12 has an active layer 13 which is suitable for generating the first light 19 during operation. The mirror layers 5, 6 applied to the light-outcoupling surface 3 and the rear surface 4 are embodied in such a way that the first light 19 cannot exit the first resonator 1 in the longitudinal direction 93 and thus not in the resonator direction. In other words, the first resonator 1 is completely mirrored on both sides for the first light 19. In addition to the active layer 13, the semiconductor layer sequence 12 comprises further semiconductor layers, in particular cladding layers and waveguide layers, which are formed according to the desired waveguiding. Furthermore, the semiconductor layer sequence 12 may include additional layers such as barrier layers, current spreading layers and/or current limiting layers. In order to simplify the illustration, the layers additional to the active layer 13 are not shown. The semiconductor layer sequence 12 and especially the active layer 13 can be based on a compound semiconductor material system described in the general part above, e.g., on InAlGaN or InAlGaP or InAlGaAs.

As indicated in FIGS. 1A and 1B, here and in the following the lateral direction 91 is a direction perpendicular to the longitudinal direction 93 and parallel to a main extension direction of the layers of the semiconductor layer sequence 2 when viewed onto the light-outcoupling surface 3. Here and in the following, the arrangement direction of the layers of the semiconductor layer sequence 12 is referred to as the vertical direction 92. The lateral direction 91 and the longitudinal direction 93 thus span a horizontal plane parallel to the main extension plane of the active layer 13 and the other layers of the semiconductor layer sequence 12. The lateral direction 91 and the vertical direction 92 span a transversal plane.

As further shown in FIGS. 1A and 1B, an electrode layer 14 is applied to a top side of the semiconductor layer sequence 12 and is provided for electrical contacting of the semiconductor layer sequence 12. The electrode layer 14, for example, can comprise one or more of the following metals: Ag, Al, Au, Ni, Pt, Pd. The semiconductor laser diode 100 may have an additional electrode layer, which is not shown for the sake of clarity, for electrical contacting the other side of the semiconductor layer sequence 12. The first resonator 1 is energized during operation via the electrode layers and thus forms an electrically-pumped laser, which generates the first light 19 during operation.

A ridge waveguide structure 16 is further formed in the top side of the semiconductor layer sequence 12 by removing a portion of the semiconductor material from that side of the semiconductor layer sequence 12. The ridge waveguide structure 16 runs along the longitudinal direction 93 and is bounded in the lateral direction 91 on both sides by lateral surfaces. The ridge side surfaces and the remaining top side of the semiconductor layer sequence 12 are covered by a passivation material 17, for example, $SiO_2$, $AlO_2$, $ZrO_2$, $Si_3N_4$ and/or SiON in the form of one or more passivation layers. Due to the refractive index jump because of the transition from the semiconductor material to the passivation material 17 at the side surfaces of the ridge waveguide structure 16, which are delimiting in the lateral direction 91, a so-called index guidance of the first light 19 generated in the active layer 13 can be effected, which significantly leads to the formation of the active region 15.

As shown in FIG. 1A, the ridge waveguide structure 16 can be formed by completely removing the semiconductor material laterally on both sides of the ridge. Alternatively, a so-called "tripod" can also be formed, as indicated in FIG. 1C, in which the semiconductor material is removed laterally next to the ridge only along two grooves. Alternatively, the semiconductor laser diode 100 can also be embodied as a so-called broad-area laser diode without a ridge waveguide structure, as indicated in FIG. 1D. In this variant, a gain guiding of the laser modes occurs rather than an index guiding. The active region 15 is defined by the contact region of the electrode layer 4 with the semiconductor material of the semiconductor layer sequence 12 and thus by the opening in the passivation material 17, which thus forms a current diaphragm.

The semiconductor laser diode 100 also has a substrate 9, which in the embodiment shown is the laser-active material 21 of the second resonator 2 and which is also, for example, a growth substrate for the semiconductor layer sequence 12. For this purpose, the semiconductor layer sequence 12 can be grown directly on the laser-active material 21, which is provided as a wafer. The epitaxial disc produced in this way is then structured so that the facets of the resonators can be produced, for example, by breaking the disc.

As an alternative to a growth substrate, the substrate 9 can also be a carrier substrate to which the semiconductor layer sequence 12 grown on a growth substrate is transferred after growth and attached by wafer bonding, for example. In particular, the semiconductor layer sequence 12 can be removed from the growth substrate by means of laser lift-off, for example, in a process also referred to as thin-film process or thin-film-like process, and attached to the second resonator 2 by means of a connecting layer described below.

For example, the laser-active material 21 of the second resonator 2 and thus the substrate 9 can comprise GaN, sapphire, SiC, YAG or YVO$_4$. Furthermore, the laser-active material 21 of the second resonator 2 and thus the substrate 9 may have at least one dopant acting as a luminous center, which may in particular be selected from Ce, Cr, Er, Nd, Ti, Pr and Yb. In a particularly preferred variant, for example, the first resonator 1 may comprise a semiconductor layer sequence 12 based on InAlGaN, while for the second resonator 2 a Ti-doped sapphire wafer is used as laser-active material 21 and thus as substrate 9 for the semiconductor layer sequence 12. The first resonator 1 can, for example, be grown by heteroepitaxy on the laser-active material 21 of the second resonator 2 or transferred to it by wafer bonding.

As can be seen in FIGS. 1A and 1B, the first resonator 1 and the second resonator 2 are arranged offset to each other in a direction perpendicular to the longitudinal direction 93, i.e., in a direction parallel to the transverse plane, wherein the resonator directions of the resonators 1, 2 are parallel to each other. In particular, the resonators 1, 2 in the embodiment shown are arranged offset to each other along the vertical direction 91. The spacing of the laser-active materials 11, 21 is selected such that the active region 15 of the first resonator 1 and thus part of the laser modes forming the first light 19 extends into the second resonator 2, so that during operation of the semiconductor laser diode 100 and thus during operation of the first resonator 1 first light 19 is decoupled from the first resonator 1 and coupled into the second resonator 2. This allows the laser-active material 21 of the second resonator to be excited while forming the active region 25 and thus to be optically pumped, so that the second resonator 2 is excited to generate the second light 29. The first light 19 of the first resonator 1 thus forms a pumping light for the optical pumping of the second resonator 2. The outcoupling mirror layer 5 applied to the light-outcoupling surface 3 has a partial transmission for the second light 29, so that the second light 29 from the second resonator 2 can be partially emitted outwards. The rear-side mirror layer 6, on the other hand, can form a full mirroring for the second light 29. Accordingly, the first resonator 1 forms an electrically-pumped pump beam source, while the second resonator forms a beam source optically-pumped by the first resonator 1. The part of the second light 29 that is emitted to the outside forms the laser radiation emitted by the semiconductor laser diode 100.

In summary, the semiconductor laser diode 100 described here is a semiconductor laser diode in which a further laser resonator is integrated in addition to an electrically pumped laser resonator. The second resonator 2 is located directly adjacent to the first resonator 1 in a transverse direction beside it, so that during operation the second resonator 2 is optically pumped in the transverse direction perpendicular to the longitudinal direction. Since the first resonator 1 is highly reflective on both sides as described above, it can be achieved that the laser threshold of the first resonator 1 can be strongly lowered, that an undesired emission of the pump radiation can be suppressed and that an increased coupling of the pump radiation into the second resonator 2 can take place. In particular, different wavelengths can be selected for the first and second light 19, 29 according to the choice of the laser-active materials 11, 21. For example, for the second resonator 2 a laser-active material 21 can be selected, which can be used to generate light with a wavelength that is difficult or impossible to achieve with conventional electrically pumped laser diodes, for example, in the deep UV range, in the yellow spectral range or in the IR range. As an alternative to laser operation, the first resonator 1 can also be embodied as a superluminescent diode and thus be operated below the laser threshold.

Figure 1E:
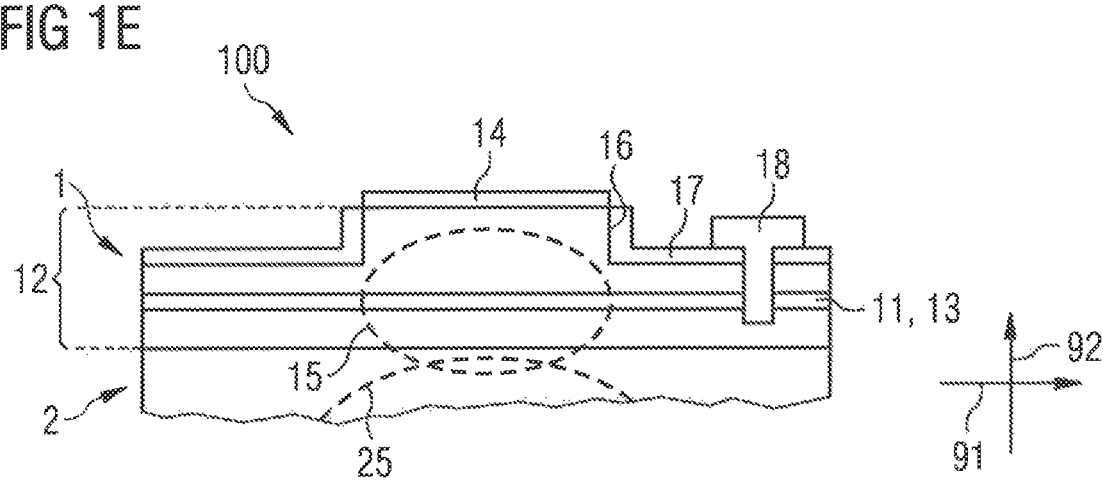
Figure 1F:
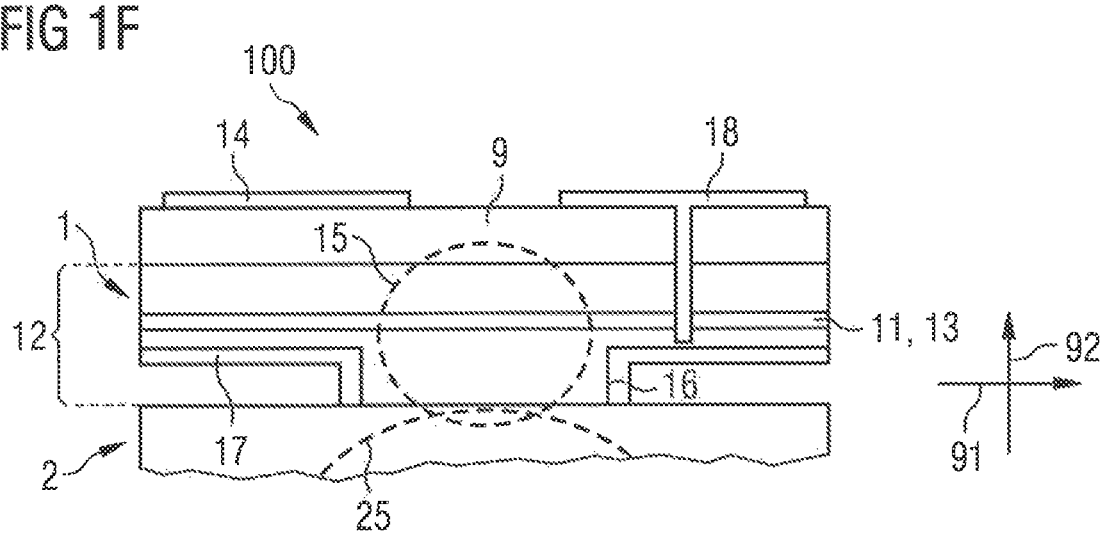

FIGS. 1E and 1F show further embodiments of semiconductor laser diodes 100 in which the semiconductor layer sequence 12 of the first resonator 1 is electrically contacted from the same side. As shown in FIG. 1E, an electrical contact element 18 in the form of an electrode layer with an electrical feedthrough may be present on the top side of the semiconductor layer sequence 12 in addition to the electrode layer 14, which electrically contacts the top side of the ridge, for example, on the top side of the semiconductor layer sequence 12; this contact element 18 extends next to the ridge waveguide structure 16 from the top side of the semiconductor layer sequence 12 through the active layer 13 to the side of the semiconductor layer sequence 12 remote from the top side. The required electrical insulation of the electrical contact element 18 on the top side and along the course through the semiconductor layers not to be contacted by the contact element 18 is not shown for the sake of clarity. The embodiment shown in FIG. 1F shows a corresponding electrical contact by means of an electrode layer 14 and a contact element 18, wherein the side that can be contacted from the outside is the side of the semiconductor layer sequence 12 opposite the ridge waveguide structure. Accordingly, the semiconductor layer sequence 12 is applied to the second resonator 2 and fastened upside down in comparison to the previous embodiments. In the embodiment shown, the first resonator 1 has the semiconductor layer sequence 12 on an electrically conductive substrate 9. Alternatively, in case of an electrically insulating substrate 9, it may also be possible to use an additional contact element 18 instead of the electrode layer 14, which extends through the substrate 9 to the semiconductor layer sequence 12. Furthermore, it may also be possible that the substrate is completely removed and the electrode layer 14 and the contact element 18 are arranged directly on the semiconductor layer sequence 12. Since the top side with the ridge waveguide structure 16 is usually p-doped, the arrangement in FIGS. 1A to 1E is also referred to as a p-up arrangement and the arrangement in FIG. 1F as a p-down arrangement. The attachment of the first resonator 1 to the second resonator 2 can be done, in case of the shown one-sided electrical contacting, by dielectric bonding or by a transparent plastic such as silicone. One-sided contacting can be advantageous for a variety of applications, such as integrated RGB displays or optical circuits.

FIGS. 1G and 1H show further embodiments of semiconductor laser diodes 100 in which the first resonator 1 and in particular the semiconductor layer sequence 12 were processed in thin-film processes described above. In the embodiment in FIG. 1G, the first resonator 1 has a carrier 98 to which the semiconductor layer sequence 12 is attached by means of a connecting material 99 such as a solder or another material suitable for wafer bonding. Instead of the growth substrate used to produce the semiconductor layer sequence 12 on the side facing away from the carrier 98, the second resonator 2 is attached to the semiconductor layer sequence 12 of the first resonator 1. In the embodiment shown in FIG. 1H, the laser-active material 21 of the second resonator 2 serves as a thin-film process-like carrier 98. The connecting material 99 can be formed like the connecting layer described below in connection with FIGS. 4 and 5.

In the following figures further embodiments of semiconductor laser diodes 100 are shown, which are modifications and further developments of the embodiments shown in FIGS. 1A to 1H. The following description therefore mainly refers to differences to the respective previous embodiments. Although in the following the first resonators 1 are shown having a semiconductor layer sequence with a ridge waveguide structure, the semiconductor layer sequence in the following embodiments can alternatively also be formed in the form of a "tripod" as shown in FIGS. 1C and 1D or the ridge waveguide structure can be omitted completely. Furthermore, electrical contacting and an arrangement of the semiconductor layer sequence as shown in FIGS. 1E to 1H may also be possible.

FIG. 2 shows an embodiment for a semiconductor laser diode 100 in which the semiconductor layer sequence 12 of the first resonator 1 has, other than, for example, the embodiment described in connection with FIGS. 1A and 1B, no cladding layer adjacent to a waveguide layer on the side facing the second resonator 2. Instead, the laser-active material 21 of the second resonator 2 serves simultaneously as a cladding layer for the first resonator 1, so that a larger overlap of the active regions 15, 25 and thus of the laser modes of the first and second resonators 1, 2 can be achieved. In this case, the refractive index of the laser-active material 21 of the second resonator 2, which serves as substrate 9, is selected accordingly in order to achieve, together with the layers of the semiconductor layer sequence 12, a desired wave guidance of the first light 19.

The laser-active material 21 serving as substrate 9 can be a growth substrate or a carrier substrate as described above. In particular, in the second case, the laser-active material may be formed as a carrier for the semiconductor layer sequence 12, which is applied by means of a thin-film-like process, as described above in conjunction with FIGS. 1G and 1H. For the sake of clarity, the connecting material used for this purpose between the carrier and the semiconductor layer sequence 12 is not shown in FIG. 2.

FIG. 3 shows an embodiment of a semiconductor laser diode 100 in which the second resonator 2 has a semiconductor material as laser-active material 21. For this purpose, the second resonator 2 may have a semiconductor layer sequence 22 with an active layer 23 and further semiconductor layers, in particular waveguide layers and cladding layers, described above in connection with the semiconductor layer sequence 12 of the first resonator 1. The two semiconductor layer sequences 12, 22 can also, for example, "share" the same cladding layer. The same semiconductor layer can therefore be formed as a cladding layer for the semiconductor layer sequence 12 of the first resonator 1 and at the same time as a cladding layer for the semiconductor layer sequence 22 of the second resonator 2. The semiconductor layer sequences 12 and 22 can be grown on different substrates and subsequently bonded to each other or alternatively grown as parts of a common semiconductor layer sequence in a common epitaxial process.

In contrast to the active layer 13 of the semiconductor layer sequence 12 of the first resonator 1, the active layer 23 of the semiconductor layer sequence 22 of the second resonator 2 is not electrically pumped, so that the semiconductor layer sequence 22 of the second resonator 2 can be located outside the current-carrying region of the semiconductor layer sequence 12 of the first resonator 1. Furthermore, it may also be possible for the electrical charge carriers required to operate the first resonator 1 to flow through the semiconductor layer sequence 22 of the second resonator 2 without causing electrical excitation in the active layer 23 of the second resonator 2. Accordingly, the semiconductor layers of the semiconductor layer sequence 22 of the second resonator 2 can, for example, be undoped or all doped with the same charge carrier type, i.e., all n-doped or all p-doped, if the second resonator 2 is on the n-side or on the p-side of the semiconductor layer sequence 12 of the first resonator 1. As in the previous embodiments, a higher pump efficiency can be achieved by the stacked arrangement of the semiconductor laser diode 100. The second resonators 2 shown in the previous and following embodiments can alternatively be embodied as laser-active material with a semiconductor material and in particular a semiconductor layer sequence according to the embodiment in FIG. 3.

FIG. 4 shows an embodiment of a semiconductor laser diode 100 in which the first resonator 1 is applied to the second resonator 2 by means of a connecting layer 7. The semiconductor layer sequence 12 of the first resonator 1 is grown on a growth substrate 9 for this purpose. The growth substrate 9 is then removed or at least significantly thinned so that in the finished semiconductor laser diode 100 the laser-active materials 11, 21 are arranged close enough so that, as in the other embodiments, a proportion of preferably greater than or equal to 10% and less than or equal to 99% of the first light is coupled into the second resonator 2. The cladding layer of the semiconductor layer sequence 12 facing the second resonator 2 is also embodied accordingly.

As in the other embodiments, the region of the semiconductor laser diode 10 between the laser-active materials 11, 21 must be sufficiently transparent for the coupling of the first light into the second resonator 2, which also applies to the connecting layer 7. The connecting layer 7 can preferably be electrically conductive if the second resonator 2 is located in the electrically energized region of the semiconductor laser diode 100. For example, the connecting layer may contain a transparent conductive oxide (TCO) such as indium tin oxide (ITO), or a semiconductor material. If no electrical current is required to flow through the connecting layer 7, the connecting layer can also be electrically insulating and, for example, comprise a transparent electrically insulating oxide.

Figure 5:
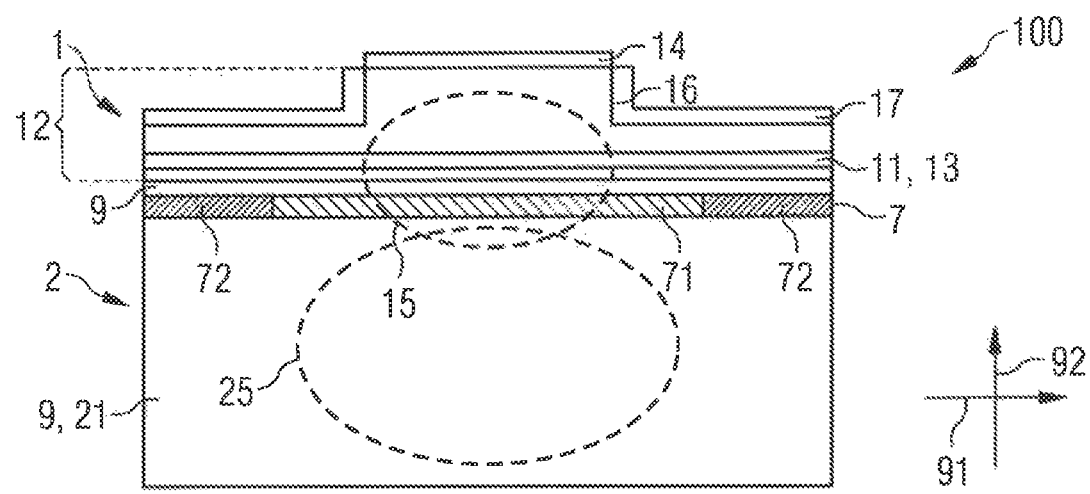

In the embodiment of FIG. 5, the connecting layer 7, compared to the previous embodiment, has a connecting layer 7, which comprises different connecting layer parts 71, 72. The connecting layer part 71, which is arranged in the region in which the optical coupling between the first and second resonators 1, 2 takes place, is transparent like the connecting layer 7 of the previous embodiment and can be electrically conductive or electrically insulating depending on the electrical requirements. Outside the region in which the laser modes of the resonators 1, 2 overlap, a different material can be selected for the connecting layer part 72, which does not have to be transparent. For example, the connecting layer part 72 can form a metallized region, for example, in the form of metal webs, which serves to form a solder connection between the resonators 1, 2 and which is particularly advantageous in the case that electric current must be conducted through the connecting layer 7 to operate the first resonator 1. If the electrical contacting shown in FIGS. 1E and 1F above is from the same side, it is advantageous to omit a metallic connecting layer part.

The connecting layer 7 shown in FIG. 4 and/or the connecting layer part 71 shown in FIG. 5 may, for example, also be of dichroic design, so that the connecting layer 7 or the connecting layer part 71 at the interface between the first and second resonators 1, 2 is predominantly or exclusively transparent to the first light. In particular, the connecting layer 7 or the connecting layer part 71 may be transparent to the first light, while the second light undergoes total reflection. This allows the second resonator 2 and in particular the active region 25 of the second resonator 2 to be additionally defined. For example, a dichroic connecting layer or a dichroic connecting layer part may be advantageous in the case of a semiconductor laser diode in which the semiconductor layer sequence of the first resonator is based on InAlGaN arranged on a second resonator whose laser-active material is sapphire, since sapphire has a lower refractive index than the nitride compound semiconductor material and therefore light from the semiconductor layer sequence can experience total reflection at the interface.

Figure 6:
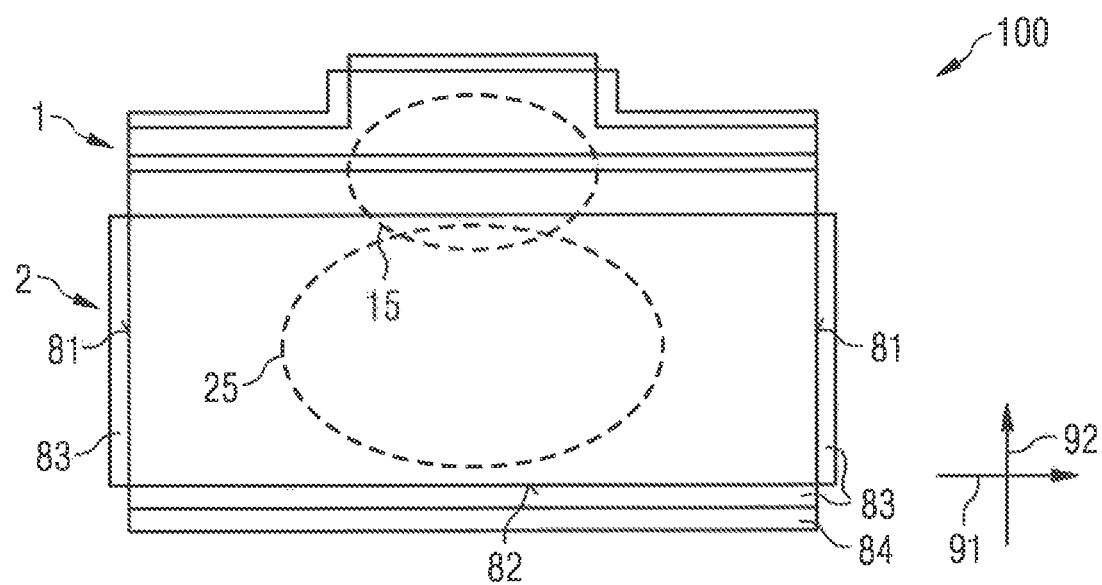

In order to lose as little light as possible on sides of the semiconductor laser diode 100 other than the light-outcoupling surface and the rear surface, the semiconductor laser diode 100 can have at least one further side surface 81 or bottom side 82 in addition to the light-outcoupling surface and the rear surface, on which a coating in the form of a mirroring 83 is applied. As shown in FIG. 6, such a coating can be applied in particular to the side surfaces 81 and the bottom side 82 of the second resonator 2. The coating can be reflective especially for the second light. Furthermore, the coating can also be partially or completely reflective for the first light. On the bottom side 82 of the second resonator 2 opposite the first resonator 1, alternatively or, as shown in FIG. 6, in addition to the coating, a mirror coating 84, in particular in the form of a Bragg mirror, can be applied, which is highly reflective for the first light, wherein the coupling efficiency of the first light into the second resonator 2 can be increased.

FIGS. 7A to 7I show embodiments of semiconductor laser diodes 100 with various possibilities for arranging the first and second resonators 1, 2. Unless otherwise stated, the resonators 1, 2 have the features as described above. In particular, as in the previous embodiments, the first and second resonators 1, 2 are arranged offset to each other in a direction perpendicular to the longitudinal direction.

Figure 7A:
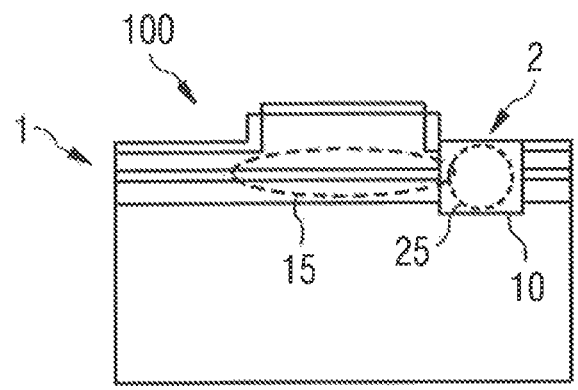
FIGS. 7A to 10B show schematic illustrations of semiconductor laser diodes according to further embodiments.
Figure 7B:
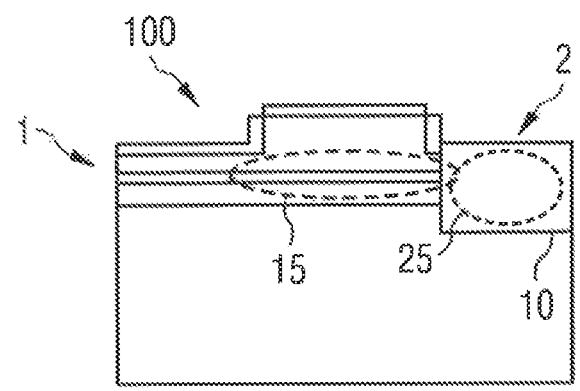
Figure 7C:
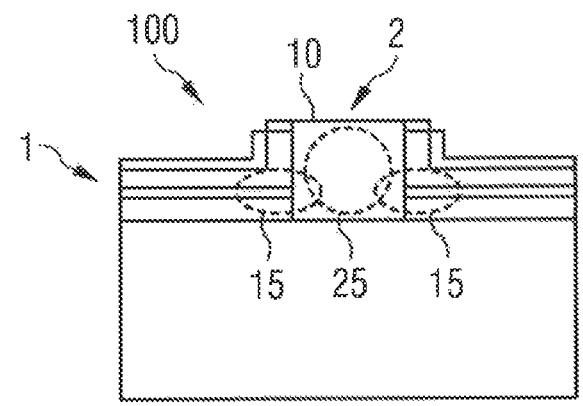
Figure 7D:
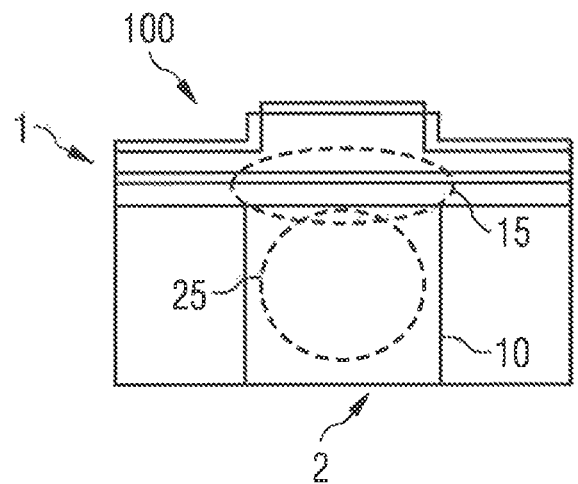

In the embodiments shown in FIGS. 7A to 7D, the first resonator 1 has an electrically contacted semiconductor layer sequence as described above. The semiconductor layer sequence is applied to a substrate, respectively. Furthermore, the first resonator 1 has a recess 10 in each case, in which the second resonator 2 is arranged. The recess 10 can in particular be embodied as a groove extending in a longitudinal direction. As shown in FIGS. 7A and 7B, the second resonator 2 may be laterally offset from the first resonator 1, in particular laterally offset from the ridge waveguide structure, for example, in the recess 10, wherein the recess 10 is laterally delimited on both sides by material of the first resonator 1 (FIG. 7A) or extending to a lateral edge of the first resonator 1 (FIG. 7B). Furthermore, as shown in FIG. 7C, the second resonator 2 may be arranged in a recess 10 in the ridge waveguide structure, the first resonator 1 having two active regions 15 laterally offset from the second resonator 2 in accordance with the laser modes formed. As shown in FIGS. 7A and 7B, the recess 10 can protrude through the semiconductor layer sequence 10 in the vertical direction 92 and, for example, also protrude into the substrate. Alternatively, the recess 10 can only project into the semiconductor layer sequence, but not into the substrate, as shown in FIG. 7C. Furthermore, the second resonator 2 can be arranged in a recess 10 in the substrate, so that the second resonator 2 and the first resonator 1 are arranged vertically offset to each other as in the previous embodiments.

Figure 7E:
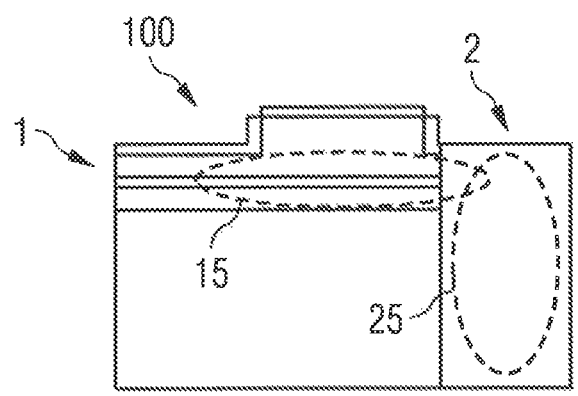
Figure 7F:
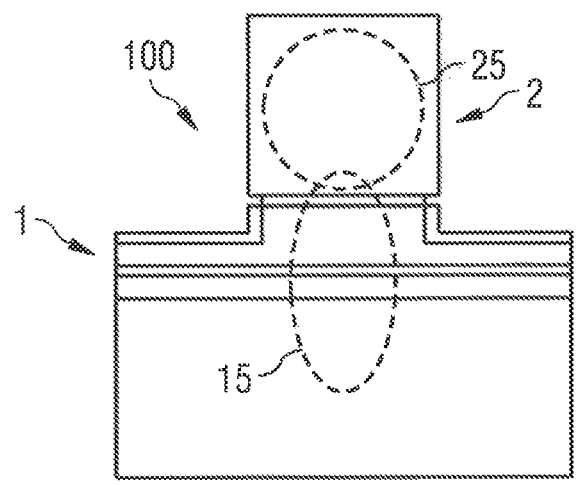

In the embodiments of FIGS. 7E and 7F, the second resonator 2 is placed on the first resonator 1 in the lateral direction (FIG. 7E) and in the vertical direction (FIG. 7F), respectively, whereas in the embodiment of FIG. 7F, a transparent electrode layer is arranged on the ridge waveguide structure in order to ensure an optical coupling between the resonators 1, 2.

Figure 7G:
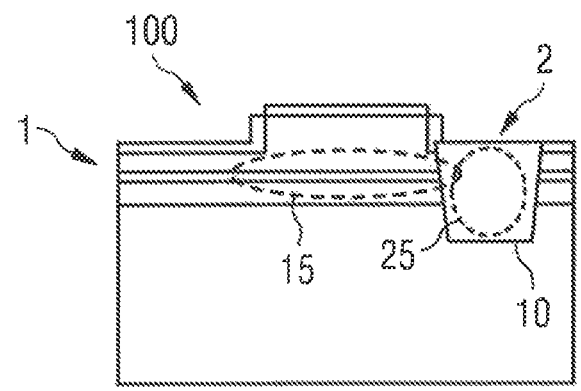
Figure 7H:
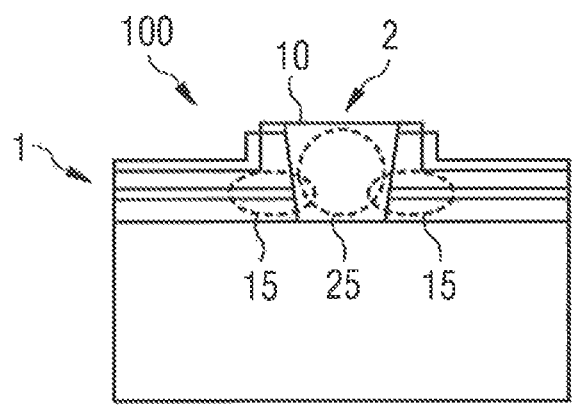
Figure 7I:
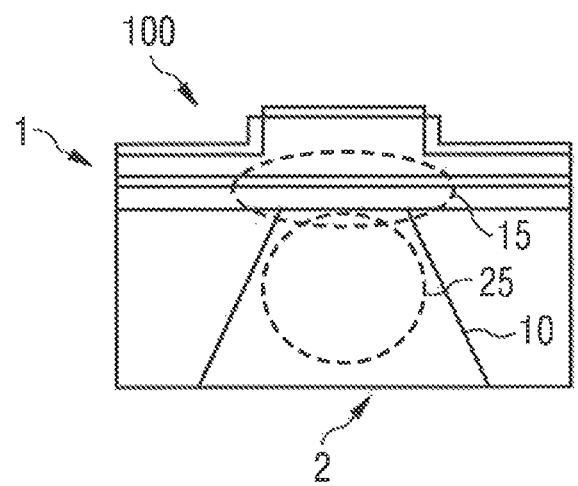

In the embodiments shown, the laser-active material of the second resonator 2 can be prefabricated and inserted into the recess 10 or attached to the material of the first resonator 1. Furthermore, it is also possible that the laser-active material of the second resonator 2 is produced in the recess 10 or on the material of the first resonator 1 by vapor deposition, sputtering, epitaxial growth or other deposition processes. In this case, the laser-active material of the second resonator 2 does not have to be inserted subsequently and special geometries can also be realized, as shown in FIGS. 7G to 7I, for example.

Figure 8A:
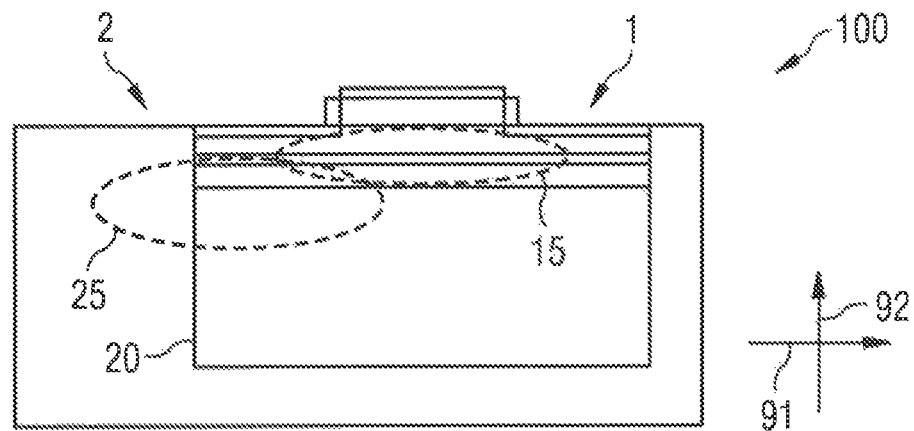
Figure 8B:
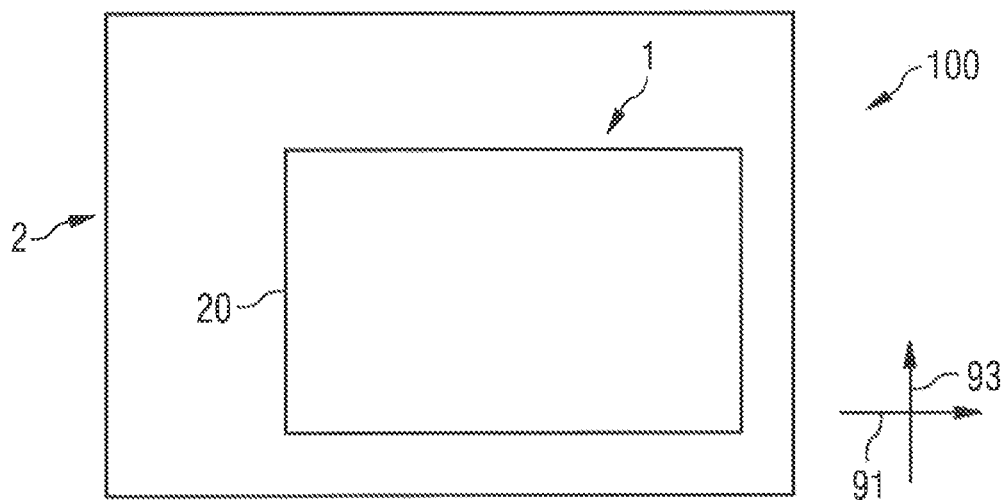

FIGS. 8A and 8B show an example of a semiconductor laser diode 10 in which the laser-active material of the second resonator 2, and thus the second resonator 2, has a recess 20 in which the first resonator 1 is arranged. FIG. 8A shows a section in a transversal plane, FIG. 8B shows a section in a horizontal plane. As one can see, the first resonator 1 is surrounded by the second resonator 2 in all directions perpendicular to the vertical direction 92. Here it can be advantageous if, as shown, the first resonator 1 is not inserted centrically in the recess 20 in the second resonator 2 and/or the resonators 1, 2 are embodied in such a way that the active regions 15, 25 are arranged offset from one another as shown.

Figure 9:
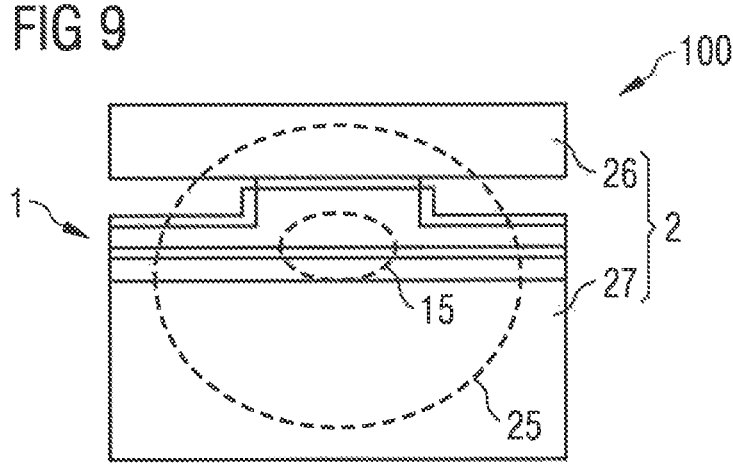

FIG. 9 shows an embodiment for a semiconductor laser diode 100, in which the second resonator 2 has a first part 26 and a second part 27, each with a laser active material, and the semiconductor layer sequence of the first resonator is arranged between the first and the second part 26, 27. As shown, the first and second part 26, 27 of the second resonator 2 and the first resonator 1 can form a kind of "sandwich structure" in a vertical direction or alternatively in a lateral direction. The first and second parts 26, 27 may preferably contain the same laser-active material, e.g., a substrate material described above, which contains a dopant acting as a light center. After growing or mounting the first resonator 1 on the first or second part 26, 27, the other part can be mounted on the first resonator 1 according to the above described examples. As shown, the pump mode, i.e., the active region 15 of the first resonator 1, can run completely within the optically pumped mode, i.e., the active region 25 of the second resonator 2.

Figure 10A:
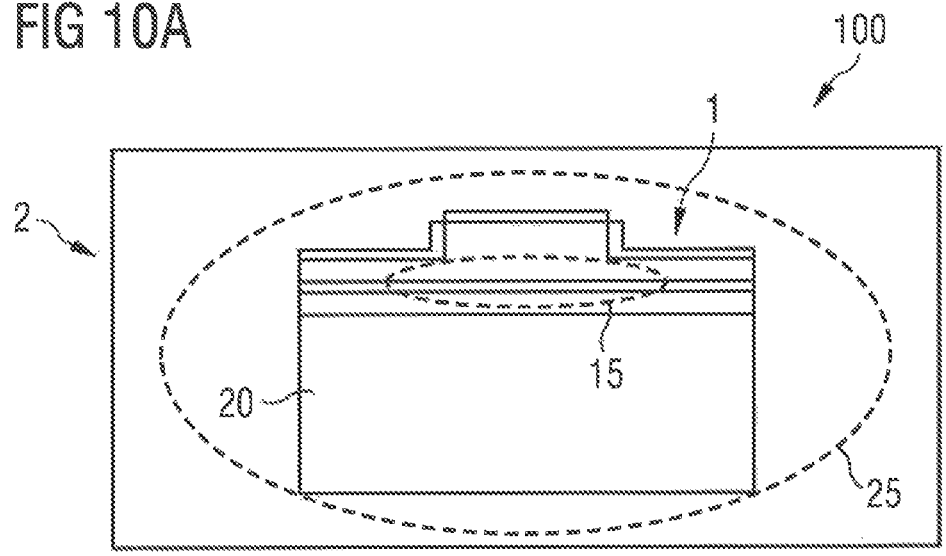
Figure 10B:
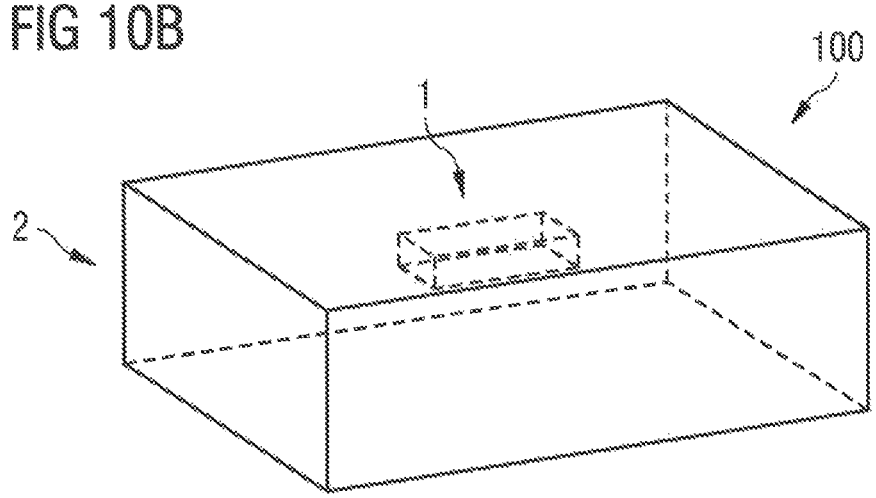

FIGS. 10A and 10B show, in a sectional view along a transverse plane and in a three-dimensional view, an embodiment of a semiconductor laser diode 100 which forms an integral component for color generation and in which the first resonator 1 is completely inserted in the second resonator, in particular in the laser-active material of the second resonator 2. For production, the laser-active material of the second resonator 2 can be pre-structured with a recess. The first resonator 1 can then, for example, be epitaxially grown and processed in the recess. Alternatively, a separately manufactured first resonator 1 can be inserted into the recess. In both cases, the inner sides of the recess can be coated with reflective material, which can form resonator mirrors for the first resonator 1 and, if necessary, further mirrorings. After electrically contacting the first resonator 1, the recess above the first resonator 1 can be filled with the laser-active material of the second resonator 2.

Figure 11A:
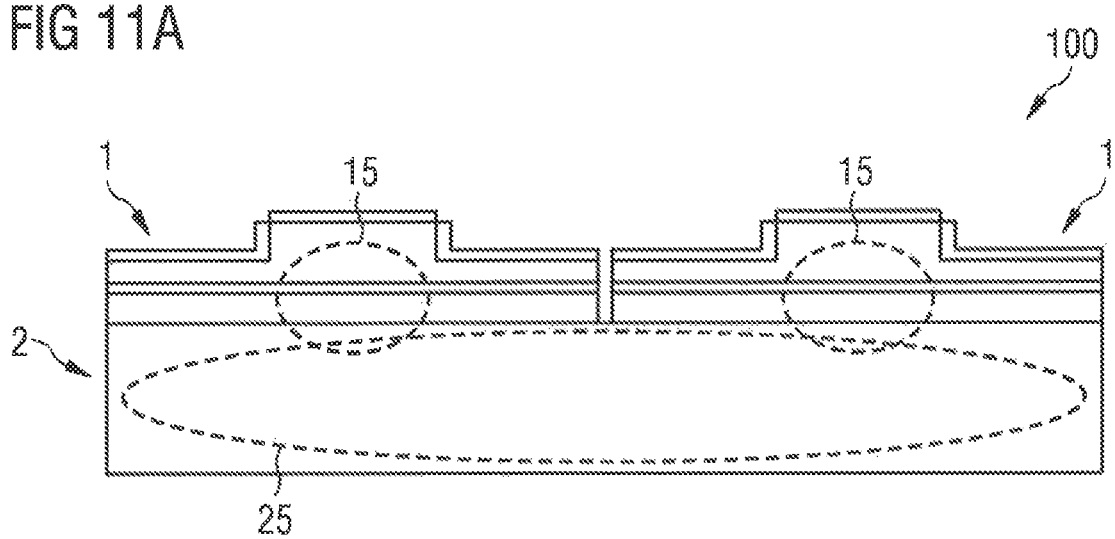
FIGS. 11A to 11E show schematic illustrations of semiconductor laser diodes according to further embodiments.
Figure 11B:
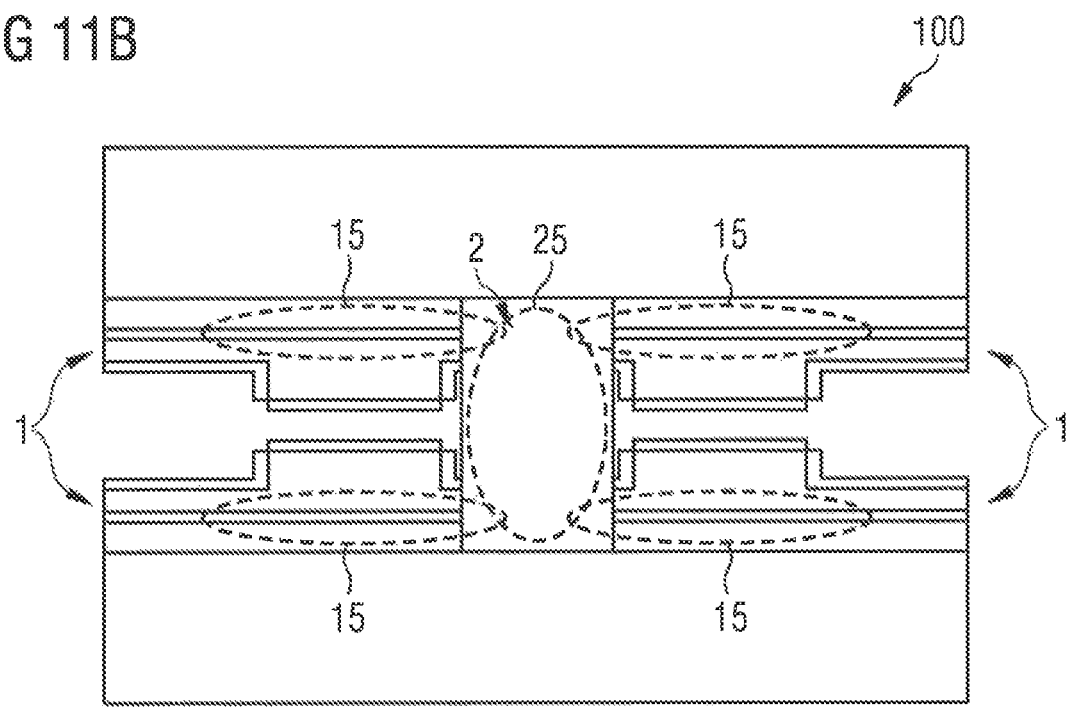
Figure 11C:
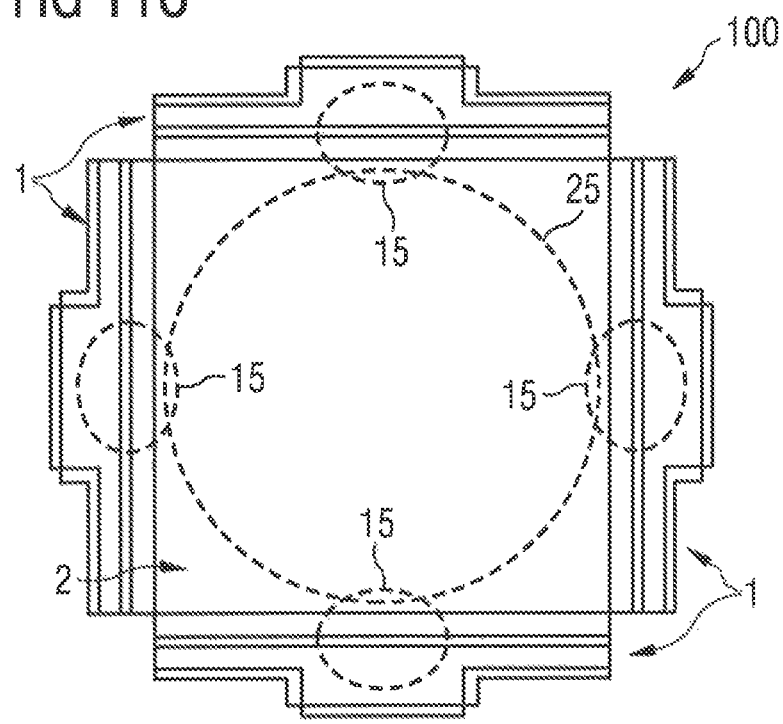
Figure 11D:
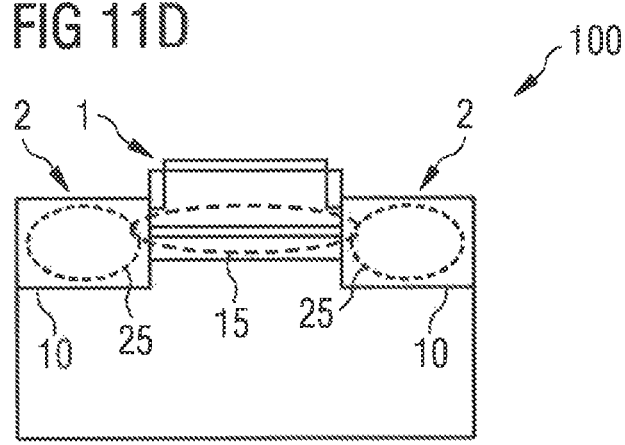
Figure 11E:
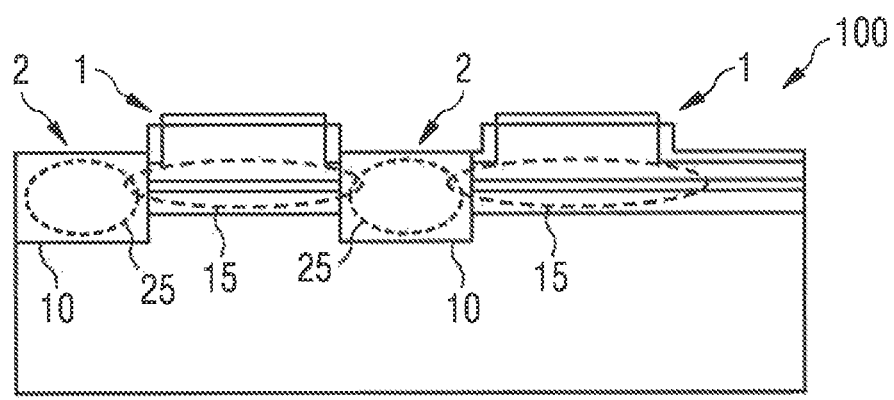

FIGS. 11A to 11E show embodiments of semiconductor laser diodes 100 having a plurality of first resonators 1 and/or a plurality of second resonators 2, with each semiconductor laser diode 100 having all first and second resonators 1, 2 monolithically integrated therein. Unless otherwise stated, the first and second resonators 1, 2 have features according to the previous embodiments. As shown in FIGS. 11A to 11C, several first resonators 1 can optically pump a second resonator 2. Furthermore, a first resonator 1 can also optically pump several second resonators 2, as shown in FIG. 11D. In addition, several first and several second resonators 1, 2 may be present, as shown in FIG. 11E. As an alternative to the embodiments shown, other numbers and arrangements of first and second resonators 1, 2 may also be present.

Figure 12A:
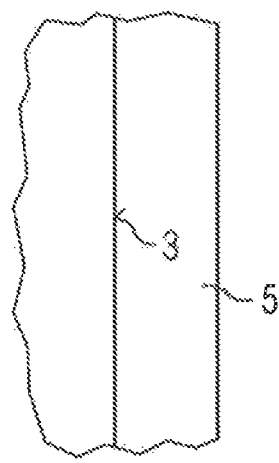
FIGS. 12A to 12D show schematic illustrations of layers of outcoupling mirrors according to further embodiments.
Figure 12B:
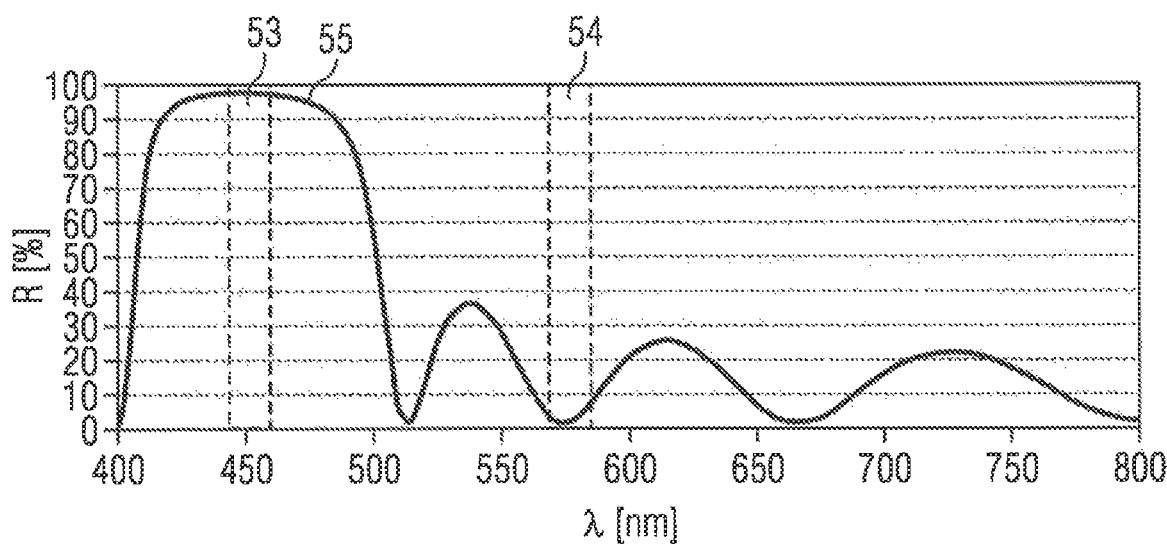

FIGS. 12A to 12D show embodiments of outcoupling mirror layers 5 on the light-outcoupling surface 3 of the semiconductor laser diode. FIG. 12A shows an outcoupling mirror layer 5 formed by a Bragg mirror, which serves simultaneously as a resonator mirror for the first resonator and as a resonator mirror for the second resonator. The wavelength-dependent reflectivity 55 of the outcoupling mirror layer 5, i.e., the dependence of the reflectivity R on the wavelength λ is shown in FIG. 12B. Furthermore, in FIG. 12B the wavelength range 53 of the first light and the wavelength range 54 of the second light are indicated by the dotted rectangles. The mirror material is designed to be highly reflective for the first light, i.e., preferably completely reflective, while the second light is only reflected as strongly as is required for efficient operation of the second resonator.

Figure 12C:
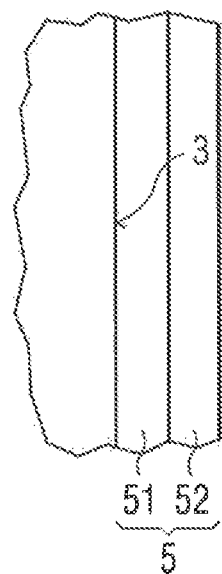
Figure 12D:
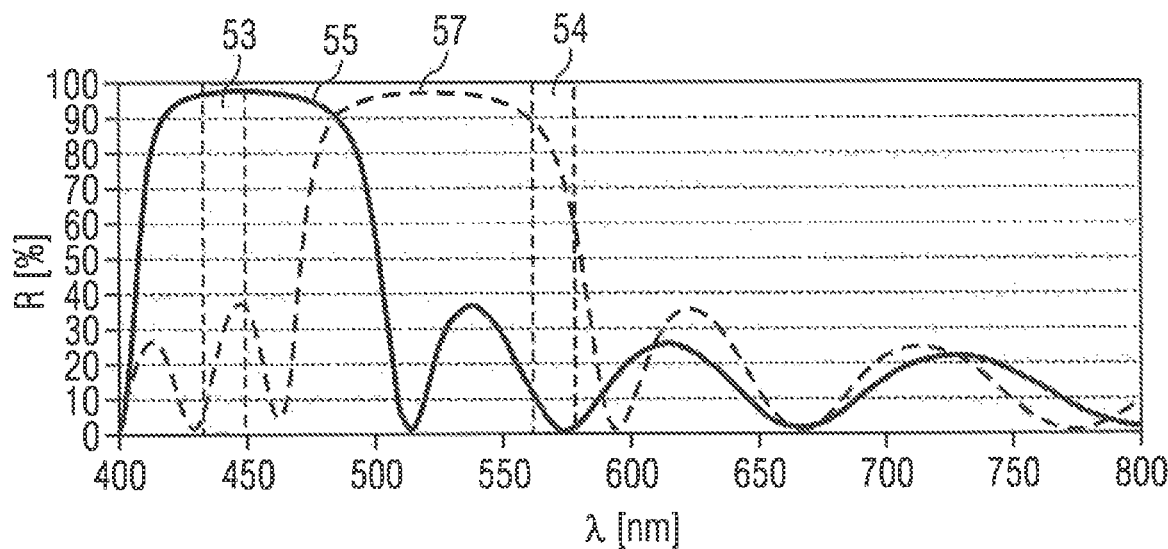

FIG. 12C shows an outcoupling mirror layer 5 comprising a first mirror layer 51 and a second mirror layer 52, each of which is a Bragg mirror. The first mirror layer 51 has a mirror material which, as shown in FIG. 12D with the help of the wavelength-dependent reflectivity 56, is highly reflective, i.e., preferably completely reflective, for the first light and thus forms a resonator mirror for the first resonator. For the second light, the first mirror layer 51 is transparent or at least partially transparent. The second mirror layer 52, whose wavelength-dependent reflectivity 57 is also shown in FIG. 12D, is more reflective for the second light than the first mirror layer 51 and is especially optimized for the second light. The second mirror layer 52 thus forms a resonator mirror for the second resonator. The effect of the second mirror layer 52 on the first light is secondary, since the first mirror layer 51 is already highly reflective for the first light. The shown version with first and second mirror layer 51, 52 allows the reflective properties of the outcoupling mirror layer 5 to be adjusted independently with respect to the first and second light. As an alternative to the arrangement of the first and second mirror layers 51, 52 on top of each other, they can also be arranged next to each other in the respective resonator regions. The mirror layers 51, 52 can be applied from different directions by means of shadow masks and/or vapor deposition.

In combination with the shown outcoupling mirror layers, rear-side mirror layers can be used in single- or multi-layer configurations, which are highly reflective for both the first and the second light, i.e., particularly preferable completely reflective. The rear-side mirror layers can also have Bragg mirrors or other reflector materials such as a metal.

The embodiments and features shown in the figures are not limited to the respective combinations shown in the figures. Rather, the shown embodiments as well as single features can be combined with one another, even if not all combinations are explicitly described. Moreover, the embodiments described in connection with the figures may alternatively or additionally comprise further features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

The invention claimed is:

1. A semiconductor laser diode comprising:
   a first resonator; and
   a second resonator,
   wherein the first and second resonators have parallel resonator directions along a longitudinal direction and are monolithically integrated into the semiconductor laser diode,
   wherein the first resonator comprises at least a part of a semiconductor layer sequence comprising an active layer and an active region configured to be electrically pumped and to generate a first light,
   wherein the longitudinal direction is parallel to a main extension plane of the active layer and perpendicular to a growth direction of the semiconductor layer sequence,
   wherein the second resonator has an active region with a laser-active material configured to be optically pumped by at least a part of the first light and configured to generate a second light which is partially emitted outwards from the second resonator,
   wherein the first and second resonators are optically and mechanically coupled to each other along a surface perpendicular to a light-outcoupling surface by an at least partially transparent connecting layer which is dichroic and which is at least partially transparent to the first light and opaque to the second light, and
   wherein the connecting layer is arranged between the first resonator and the second resonator.

2. The semiconductor laser diode according to claim 1, wherein the first resonator and the second resonator are offset to each other in a direction perpendicular to the longitudinal direction.

3. The semiconductor laser diode according to claim 1, wherein the first and second resonators are arranged one above the other in a vertical direction corresponding to the growth direction of the semiconductor layer sequence.

4. The semiconductor laser diode according to claim 1, wherein the second resonator comprises a first part and a second part, each part comprising the laser-active material, and wherein the semiconductor layer sequence of the first resonator is arranged between the first part and the second part.

5. The semiconductor laser diode according to claim 1, wherein the first and second resonators are arranged side by side in a lateral direction perpendicular to both the longitudinal and vertical directions.

6. The semiconductor laser diode according to claim 1, wherein the second resonator comprises a recess in which the first resonator is arranged.

7. The semiconductor laser diode according to claim 1, wherein the first resonator comprises a recess in which the second resonator is arranged.

8. The semiconductor laser diode according to claim 1, wherein the active region of the second resonator comprises:
   at least in part a material that is selected from the group consisting of GaN, SiC, sapphire, YAG and $YVO_4$; and
   at least one dopant which acts as luminous center and which is selected from the group consisting of Ce, Cr, Er, Nd, Ti, Pr and Yb.

9. The semiconductor laser diode according to claim 1, wherein the active region of the second resonator comprises at least a part of the semiconductor layer sequence.

10. The semiconductor laser diode according to claim 9, wherein the first and second resonators are parts of the same semiconductor layer sequence.

11. The semiconductor laser diode according to claim 1, wherein the semiconductor layer sequence of the first resonator is free of cladding layers on a side facing the laser-active material of the second resonator, and the laser-active material of the second resonator forms a cladding layer for the first resonator.

12. The semiconductor laser diode according to claim 1, wherein the semiconductor laser diode comprises a plurality of first resonators and/or a plurality of second resonators, and all of the first and second resonators of the semiconductor laser diode are monolithically integrated into the semiconductor laser diode.

13. The semiconductor laser diode according to claim 1, wherein the first resonator is completely mirror-coated on two sides for the first light.

14. The semiconductor laser diode according to claim 1, wherein the semiconductor laser diode comprises:
   a first side surface forming the light-outcoupling surface;
   a second side surface forming a rear surface; and
   an outcoupling mirror layer provided on the first side surface,
   wherein the mirror layer is configured to completely reflect the first light and is partially transparent to the second light.

15. The semiconductor laser diode according to claim 14, wherein the outcoupling mirror layer comprises a first mirror layer and second mirror layer, the first mirror layer being fully reflective to the first light and the second mirror layer being more reflective to the second light than the first mirror layer.

16. The semiconductor laser diode according to claim 1, wherein the semiconductor laser diode comprising:
   a first side surface forming the light-outcoupling surface;
   a second side surface forming a rear surface; and
   at least one further side surface and/or a bottom side on which a mirroring is located.

17. A semiconductor laser diode comprising:
   a first resonator;
   a second resonator;
   a first side surface forming a light-outcoupling surface; and
   an outcoupling mirror layer located on the first side surface,
   wherein the first and second resonators have parallel resonator directions along a longitudinal direction and are monolithically integrated into the semiconductor laser diode,
   wherein the first resonator comprises at least a part of a semiconductor layer sequence having an active layer and an active region configured to be electrically pumped and to generate a first light,
   wherein the longitudinal direction is parallel to a main extension plane of the active layer and perpendicular to a growth direction of the semiconductor layer sequence,
   wherein the second resonator has an active region with a laser-active material configured to be optically pumped by at least a part of the first light to generate a second light partially emitted outwards from the second resonator,
   wherein the first and second resonators are optically and mechanically coupled to each other along a surface perpendicular to the light-outcoupling surface by an at least partially transparent connecting layer which is dichroic and which is at least partially transparent to the first light and opaque to the second light,
   wherein the first side surface is perpendicular to the longitudinal direction, and
   wherein the connecting layer is configured for a wafer bonding of the first resonator with the second resonator.

18. The semiconductor laser diode according to claim 17, wherein the first resonator and the second resonator are offset to each other in a direction perpendicular to the longitudinal direction.

19. The semiconductor laser diode according to claim 17, wherein the active region of the second resonator comprises:
   at least in part a material that is selected from the group consisting of GaN, SiC, sapphire, YAG and $YVO_4$; and
   at least one dopant which acts as luminous center and which is selected from the group consisting of Ce, Cr, Er, Nd, Ti, Pr and Yb.

20. The semiconductor laser diode according to claim 17, wherein the semiconductor laser diode comprises a second side surface forming a rear surface, and wherein the mirror layer is configured to completely reflect the first light and is partially transparent to the second light.

21. A semiconductor laser diode comprising:
   a first resonator;
   a second resonator;
   a first side surface forming a light-outcoupling surface; and
   an outcoupling mirror layer located on the first side surface,
   wherein the first and second resonators have parallel resonator directions along a longitudinal direction and are monolithically integrated into the semiconductor laser diode,
   wherein the first resonator comprises at least a part of a semiconductor layer sequence having an active layer and an active region configured to be electrically pumped and to generate a first light,
   wherein the longitudinal direction is parallel to a main extension plane of the active layer and perpendicular to a growth direction of the semiconductor layer sequence, and a lateral direction is perpendicular to the longitudinal direction and the growth direction,
   wherein the second resonator has an active region with a laser-active material configured to be optically pumped by at least a part of the first light to generate a second light which is partially emitted outwards from the second resonator,
   wherein the first and second resonators are optically and mechanically coupled to each other along a surface perpendicular to the light-outcoupling surface by an at least partially transparent connecting layer which is dichroic and which is at least partially transparent to the first light and opaque to the second light,
   wherein a main extension plane of the connecting layer extends in the longitudinal and lateral directions, and
   wherein the first side surface extends in the lateral and growth directions.

* * * * *